United States Patent
Lee et al.

(10) Patent No.: US 10,008,539 B2
(45) Date of Patent: Jun. 26, 2018

(54) MAGNETORESISTIVE RANDOM ACCESS MEMORY DEVICE AND METHOD OF MANUFACTURING THE SAME

(71) Applicant: SAMSUNG ELECTRONICS CO., LTD., Suwon-si, Gyeonggi-do (KR)

(72) Inventors: Jae-Kyu Lee, Seongnam-si (KR); Sung-In Kim, Hwaseong-si (KR); Ki-Seok Suh, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/234,257

(22) Filed: Aug. 11, 2016

(65) Prior Publication Data

US 2017/0170234 A1 Jun. 15, 2017

(30) Foreign Application Priority Data

Dec. 11, 2015 (KR) ........................ 10-2015-0176986

(51) Int. Cl.
*H01L 27/22* (2006.01)
*G11C 11/16* (2006.01)

(52) U.S. Cl.
CPC ........ *H01L 27/228* (2013.01); *G11C 11/1655* (2013.01); *G11C 11/1659* (2013.01)

(58) Field of Classification Search
CPC .................... H01L 43/12; H01L 43/08; G01R 33/09–33/098; G01R 15/205; G11B 5/39–5/3993; G11B 2005/3996; G11B 5/3909; H03B 15/006
See application file for complete search history.

(56) References Cited

U.S. PATENT DOCUMENTS

| | | | |
|---|---|---|---|
| 6,473,336 B1 | 10/2002 | Nakajima et al. | |
| 6,608,776 B2 | 8/2003 | Hidaka | |
| 7,787,290 B2 | 8/2010 | Takemura et al. | |
| 7,869,259 B2 | 1/2011 | Asao | |
| 7,919,794 B2 | 4/2011 | Gu et al. | |
| 2008/0043514 A1* | 2/2008 | Ueda ........................ | G11C 7/02 365/148 |
| 2010/0002492 A1 | 1/2010 | Kajiyama | |
| 2014/0204661 A1 | 7/2014 | Doyle et al. | |

(Continued)

FOREIGN PATENT DOCUMENTS

JP 2008-258362 A 10/2008

*Primary Examiner* — Julia Slutsker
(74) *Attorney, Agent, or Firm* — Lee & Morse, P.C.

(57) ABSTRACT

A magnetoresistive random access memory (MRAM) device including a substrate including a plurality of active patterns arranged along a first direction, each of the active patterns extending in a diagonal direction with respect to the first direction; a plurality of gate structures on the substrate, the gate structures extending in a second direction substantially perpendicular to the first direction; a source line structure electrically connected to source regions of the respective active patterns, the source line structure extending in the first direction; a plurality of magnetic tunnel junction (MTJ) structures electrically connected to drain regions of the respective active patterns, the MTJ structures being spaced apart from each other; and a bit line structure electrically connected to the MTJ structures in respective memory cells, the memory cells sharing with the source line structure.

15 Claims, 28 Drawing Sheets

(56) References Cited

U.S. PATENT DOCUMENTS

| | | | | |
|---|---|---|---|---|
| 2016/0072052 A1* | 3/2016 | Noma | ............... | H01L 43/10 |
| | | | | 257/421 |
| 2016/0079307 A1* | 3/2016 | Lu | ............... | H01L 27/222 |
| | | | | 257/421 |
| 2016/0379701 A1* | 12/2016 | Nakatsuka | ......... | G11C 11/1659 |
| | | | | 365/51 |
| 2017/0069826 A1* | 3/2017 | Wang | ............... | G11C 11/1659 |

* cited by examiner

MAGNETORESISTIVE RANDOM ACCESS MEMORY DEVICE AND METHOD OF MANUFACTURING THE SAME

CROSS-REFERENCE TO RELATED APPLICATION

Korean Patent Application No. 10-2015-0176986, filed on Dec. 11, 2015, in the Korean Intellectual Property Office, and entitled: "Magnetoresistive Random Access Memory Device and Method of Manufacturing the Same," is incorporated by reference herein in its entirety.

BACKGROUND

1. Field

Embodiments relate to a magnetoresistive random access memory (MRAM) device and a method of manufacturing the same.

2. Description of the Related Art

In an MRAM device, data may be stored by changing a direction of a current using a resistance change of a magnetic tunnel junction (MTJ) structure. In order to form a highly integrated MRAM device, the MRAM device may be arranged in an optimized layout.

SUMMARY

Embodiments are directed to a magnetoresistive random access memory (MRAM) device and a method of manufacturing the same.

The embodiments may be realized by providing a magnetoresistive random access memory (MRAM) device including a substrate including a plurality of active patterns arranged along a first direction, each of the active patterns extending in a diagonal direction with respect to the first direction; a plurality of gate structures on the substrate, the gate structures extending in a second direction substantially perpendicular to the first direction; a source line structure electrically connected to source regions of the respective active patterns, the source line structure extending in the first direction; a plurality of magnetic tunnel junction (MTJ) structures electrically connected to drain regions of the respective active patterns, the MTJ structures being spaced apart from each other; and a bit line structure electrically connected to the MTJ structures in respective memory cells, the memory cells sharing with the source line structure.

The embodiments may be realized by providing a magnetoresistive random access memory (MRAM) device including a substrate including an active pattern array thereon, the active pattern array including a plurality of active pattern rows disposed in a second direction, each of the active pattern rows including a plurality of active patterns disposed in a first direction substantially perpendicular to the second direction, and each of the active patterns extending in a diagonal direction with respect to the first direction; a plurality of gate structures on the substrate, the gate structures extending in the second direction; a source line structure electrically connected to source regions of the respective active patterns, the source line extending in the first direction; a plurality of contact plugs contacting the drain regions of the respective active patterns; a plurality of pad patterns on the contact plugs, respectively; a plurality of MTJ structures on the pad patterns, respectively, the MTJ structures being spaced apart from each other; and a bit line structure electrically connecting the MTJ structures with each other, the MTJ structures being in memory cells sharing the source line structure.

The embodiments may be realized by providing a magnetoresistive random access memory (MRAM) device including a substrate including a plurality of active patterns spaced apart from one another along a first direction, each of the active patterns having a major axis that crosses the first direction and is inclined at an angle relative to the first direction; a plurality of gate structures on the substrate, the gate structures extending in a second direction that is substantially perpendicular to the first direction; a source line structure electrically connected to source regions of the respective active patterns, the source line structure extending in the first direction; a plurality of magnetic tunnel junction (MTJ) structures electrically connected to drain regions of the respective active patterns, the MTJ structures being spaced apart from each other; and a bit line structure electrically connected to the MTJ structures in respective ones of the memory cells, the bit line structure being paired with the source line structure.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
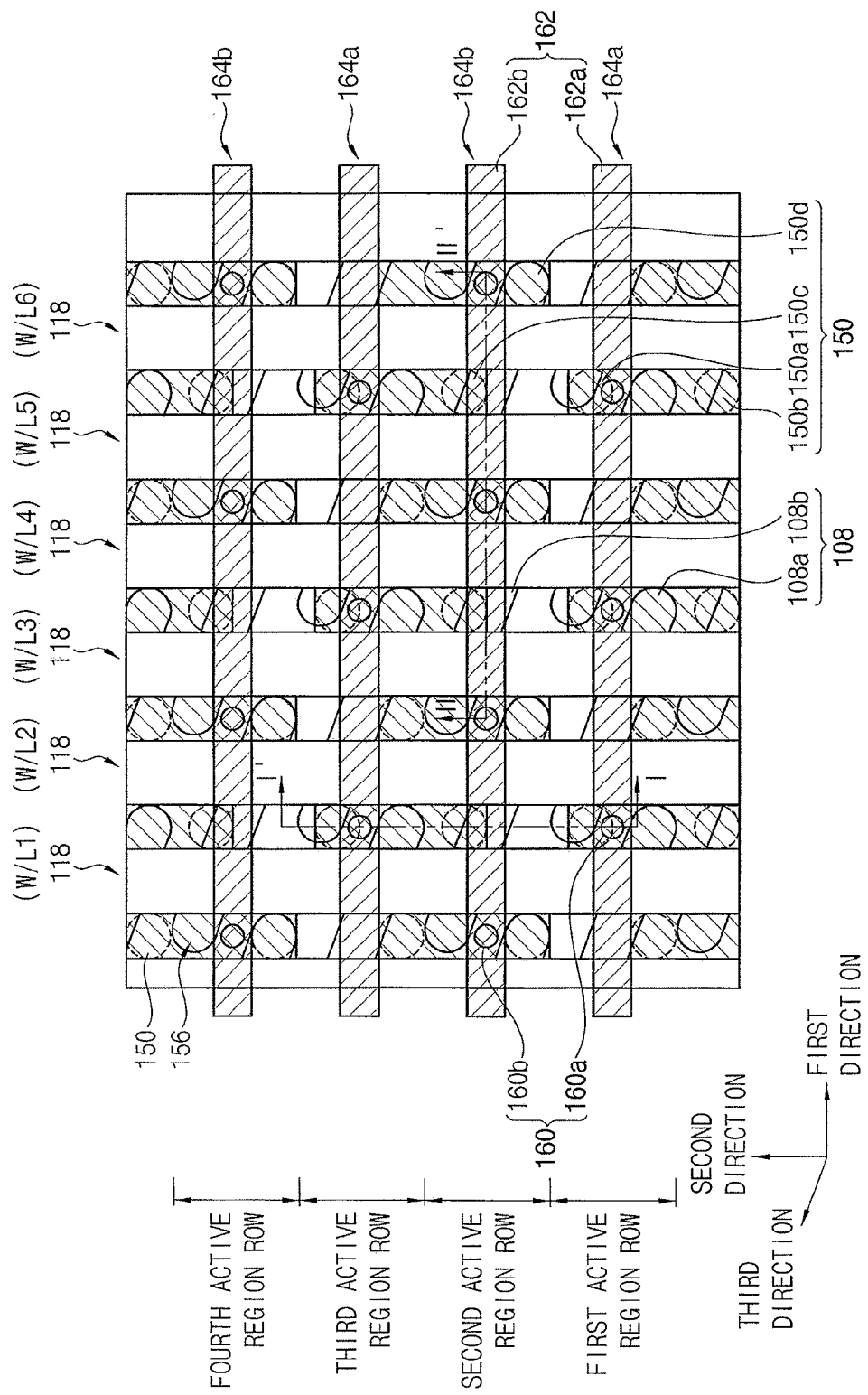
FIGS. 1 and 2 illustrate a plan view and a cross-sectional view, respectively, of an MRAM device in accordance with example embodiments.
Figure 2:
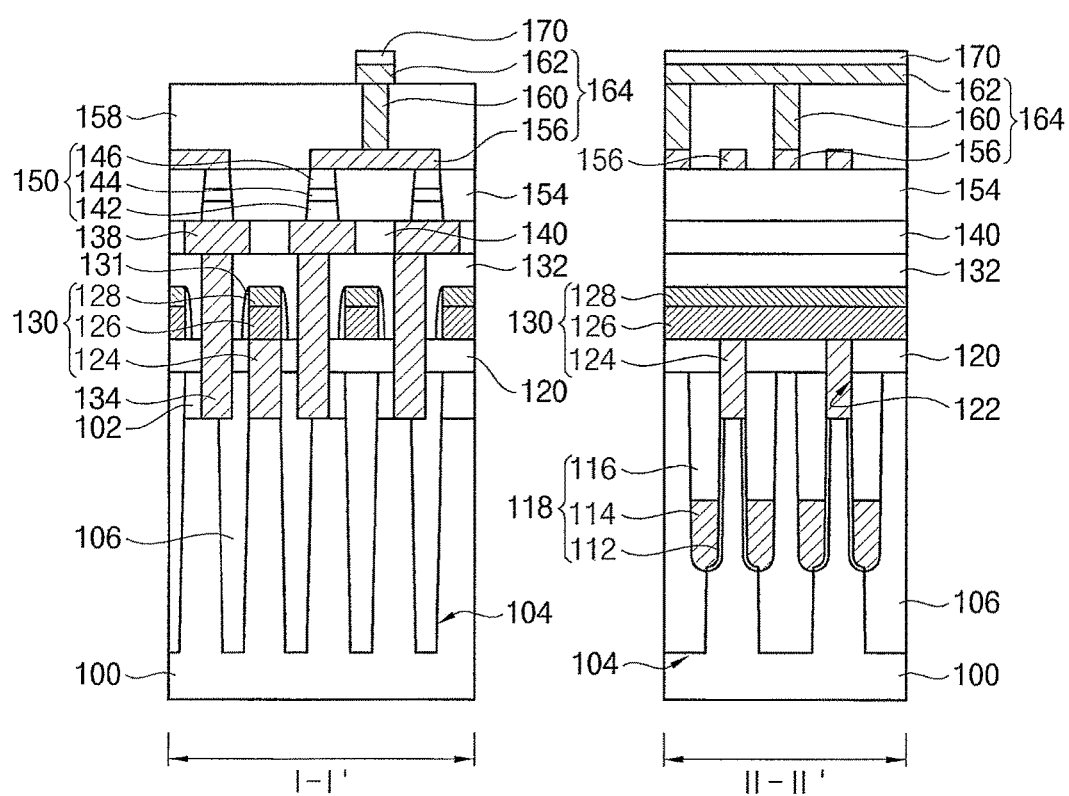

FIGS. 1 and 2 illustrate a plan view and a cross-sectional view, respectively, of an MRAM device in accordance with example embodiments.

In FIG. 1, some elements of the MRAM may be omitted for simplicity. FIG. 2 is a cross-sectional view taken along lines I-I' and II-II' of FIG. 1.

Hereinafter, first and second directions may be defined as two directions substantially parallel to a top surface of a substrate and substantially perpendicular to each other. A third direction may be defined as a direction having an acute angle with respect to the second direction.

Referring to FIGS. 1 and 2, the MRAM device may be formed on a substrate 100 including an active pattern 108. The MRAM device may include a transistor, a source line structure 130, an MTJ structure 150, and a bit line structure 164. A gate electrode of the transistor may serve as a word line.

The substrate 100 may include a semiconductor material, e.g., silicon, germanium, silicon-germanium, etc., or III-V semiconductor compounds, e.g., GaP, GaAs, GaSb, etc. In an implementation, the substrate 100 may be a silicon-on-insulator (SOI) substrate, or a germanium-on-insulator (GOI) substrate.

The substrate 100 may include a plurality of first trenches 104 thereon. An isolation layer 106 may fill each of the first trenches 104. The isolation layer 106 may include an oxide, e.g., silicon oxide. The substrate 100 may be divided into a field region (on which the isolation layer 106 is formed) and the active pattern 108 (on which no isolation layer is formed). In an implementation, a plurality of active patterns 108 may be spaced apart from each other, and each of the active patterns 108 may extend in the third direction.

Figure 5:
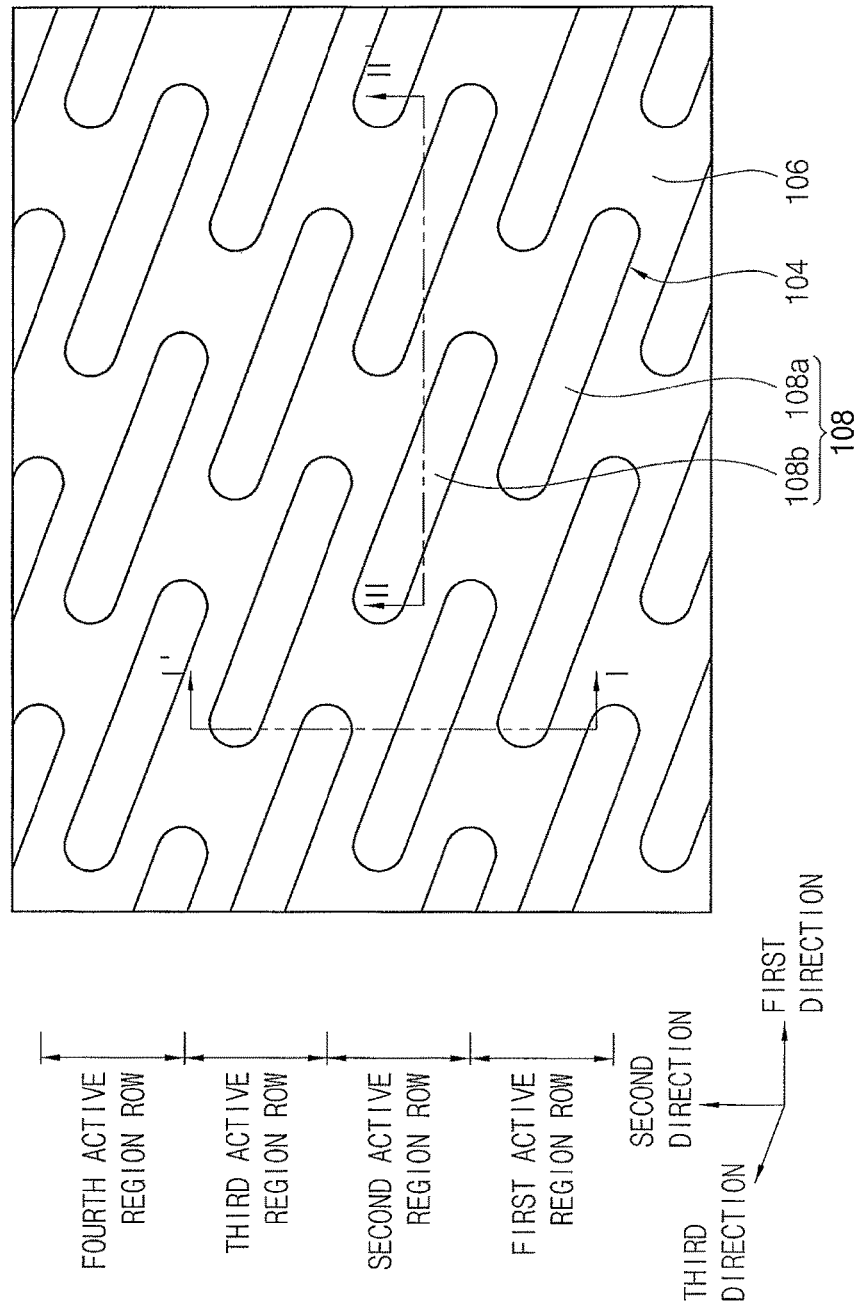
FIGS. 5 to 20 illustrate plan views and cross-sectional views of stages in a method of manufacturing an MRAM device in accordance with example embodiments.

In an implementation, the active patterns 108 may be arranged as shown in FIG. 5. Hereinafter, the arrangement of the active patterns 108 may be described with reference to FIG. 5.

Referring to FIG. 5, the substrate 100 may include a plurality of regions disposed in or arranged along the second direction, each of which may extend in the first direction. The regions may be referred to as a first region, a second region, a third region, . . . , an n-th region (n is a natural number), respectively, from a bottom toward a top of the substrate 100 in a plan view.

The active regions 108 may form an active region array that may include a plurality of active region rows disposed in or arranged along the second direction. Each active region row may include a plurality of active regions 108 disposed in or arranged along the first direction. In an implementation, each of odd-numbered active region rows may include first active regions 108a (disposed in or arranged along the first direction by a given distance, e.g., spaced apart in the first direction), and each of even-numbered active region rows may include second active regions 108b (disposed in or arranged along the first direction by a given distance, e.g., spaced apart in the first direction).

The first active regions 108a in the respective odd-numbered active region rows may be disposed in the second direction linearly (e.g., may be aligned with one another along the second direction with spaces therebetween), and the second active regions 108b in the respective even-numbered active region rows may be disposed in the second direction linearly (e.g., may be aligned with one another along the second direction with spaces therebetween). However, the first and second active regions 108a and 108b in the respective odd-numbered and even-numbered active region rows may not be disposed in the second direction linearly (e.g., the first active regions 108a may not be aligned with or may be offset relative to the second active regions 108b). For example, the first and second active regions 108a and 108b may be disposed with each other at an acute angle with respect to the first direction or the second direction.

The substrate 100 including the active patterns 108 may include a plurality of second trenches each of which may extend in the second direction. A gate structure 118 may fill each of the second trenches.

The gate structure 118 may include a gate insulation layer 112, a gate electrode 114, and a capping pattern 116. The gate insulation layer 112 may be formed on an inner surface of each of the second trenches. The gate insulation layer 112 may include an oxide, e.g., silicon oxide. The gate electrode 114 may be formed on the gate insulation layer 112 to partially fill each of the second trenches. The gate electrode 114 may extend in the second direction. The gate electrode 114 may serve as a word line of memory cells. The gate electrode 114 may include a metal, e.g., tungsten, titanium, tantalum, etc., and/or a metal nitride, e.g., tungsten nitride, titanium nitride, tantalum nitride, etc.

The capping pattern 116 may be formed on the gate electrode 114 and the gate insulation layer 112 to fill each of the second trenches. The capping pattern 116 may include a nitride, e.g., silicon nitride.

In an implementation, two gate structures 118 may be formed on each of the active patterns 108. Thus, two transistors may be formed on each of the active patterns 108, and may share a source region with each other.

Figure 7:
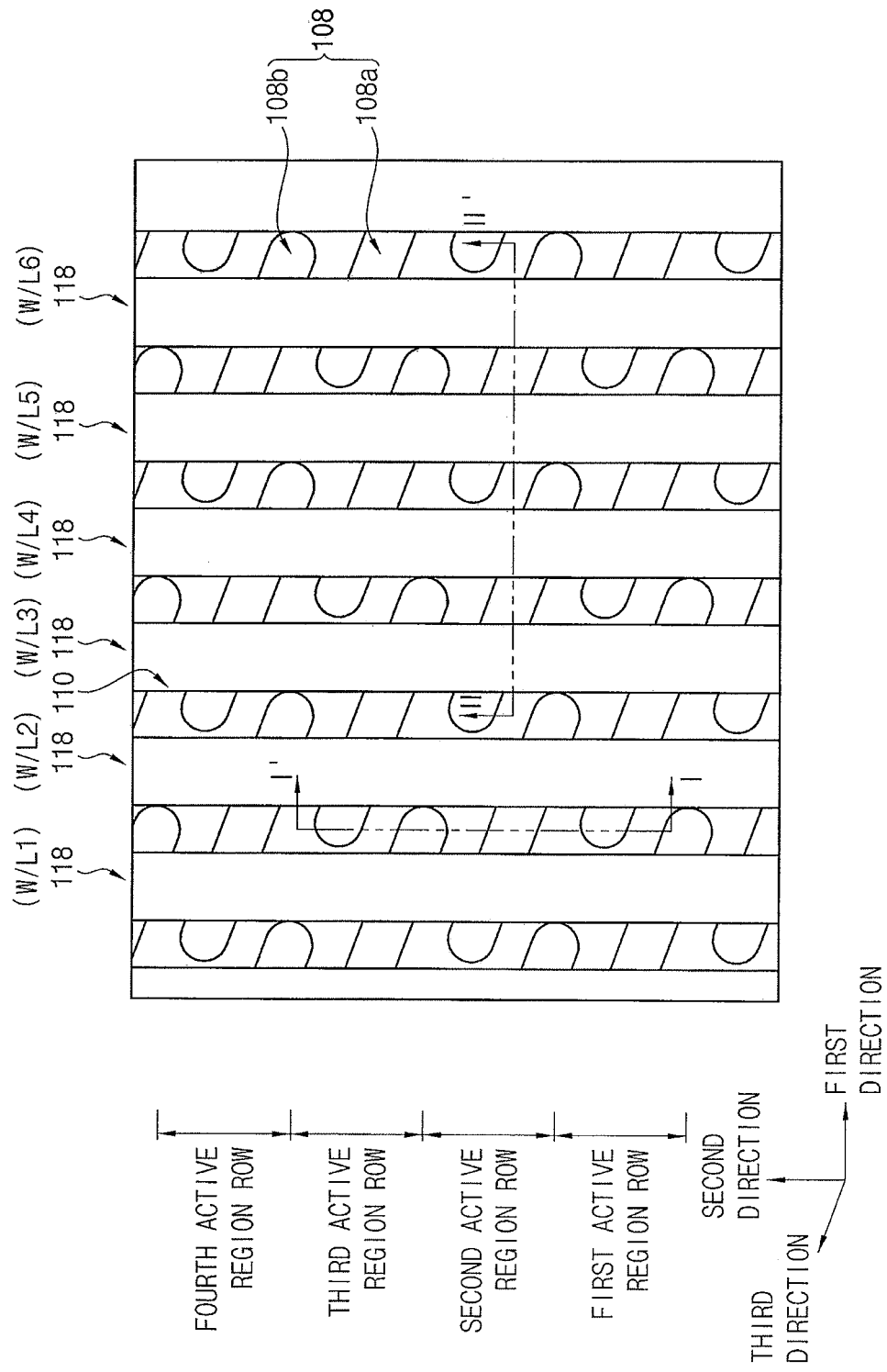

In an implementation, the word lines may be arranged on the active patterns 108 as shown in FIG. 7. Hereinafter, the arrangement of the word lines may be described with respect to FIG. 7.

Referring to FIG. 7, a plurality of word lines may be disposed in or repeatedly arranged along the first direction, and each of the word lines may extend in the second direction. The word lines may be referred to as a first word line, a second word line, a third word line, . . . , an m-th word line (m is a natural number), respectively, from a left toward a right in a plan view. FIG. 7 shows six word lines, i.e., first to sixth word lines W/L1 to W/L6 disposed in the first direction, however, the number of the word lines may not be limited thereto.

In an implementation, the first and second word lines W/L1 and W/L2 may be formed on a first one of the second active patterns 108b from the left in each of the even-numbered active region rows. The third and fourth word lines W/L3 and W/L4 may be formed on a second one of the second active patterns 108b from the left in each of the even-numbered active region rows.

The second and third word lines W/L2 and W/L3 may be formed on the first and second ones, respectively, of the second active patterns 108b in each of the even-numbered active region rows. The fourth and fifth word lines W/L4 and W/L5 may be formed on the second and third ones, respectively, of the second active patterns 108b in each of the even-numbered active region rows.

For example, different word lines may be formed on different active patterns 108, respectively, in each of the active region rows. One word line may be commonly formed on the first and second active patterns 108a and 108b in the odd-numbered and even-numbered active region rows, respectively, and thus the word line may be shared thereby.

Source/drain regions may be formed on upper portions of the active patterns 108 adjacent to the gate structure 118. Thus, a transistor including the gate structure 118 and the source/drain regions may be formed. In an implementation, the transistor may be a buried channel array transistor (BCAT). In an implementation, the gate structure may protrude from the top surface of the substrate, and in this case, the transistor may be a planar-type channel array transistor (PCAT).

A first insulating interlayer 120 may be formed on the active pattern 108, the gate structure 118, and the isolation layer 106.

The source line structure 130 may contact the source region of the active pattern 108, and may extend in the first direction. The source region may be formed at an upper portion of the active pattern 108 between the gate structures 118.

In an implementation, the source line structure 130 may include a source contact plug 124, a source line 126, and a second hard mask 128. The source contact plug 124 may extend through the first insulating interlayer 120 and the first hard mask 102, and may contact the source region. The source line 126 may be formed on the first insulating interlayer 120, and may contact the source contact plug 124.

The source line 126 and/or the source contact plug 124 may include a metal, a metal silicide, a metal nitride, polysilicon, etc. The second hard mask 128 may include a nitride, e.g., silicon nitride.

Figure 9:
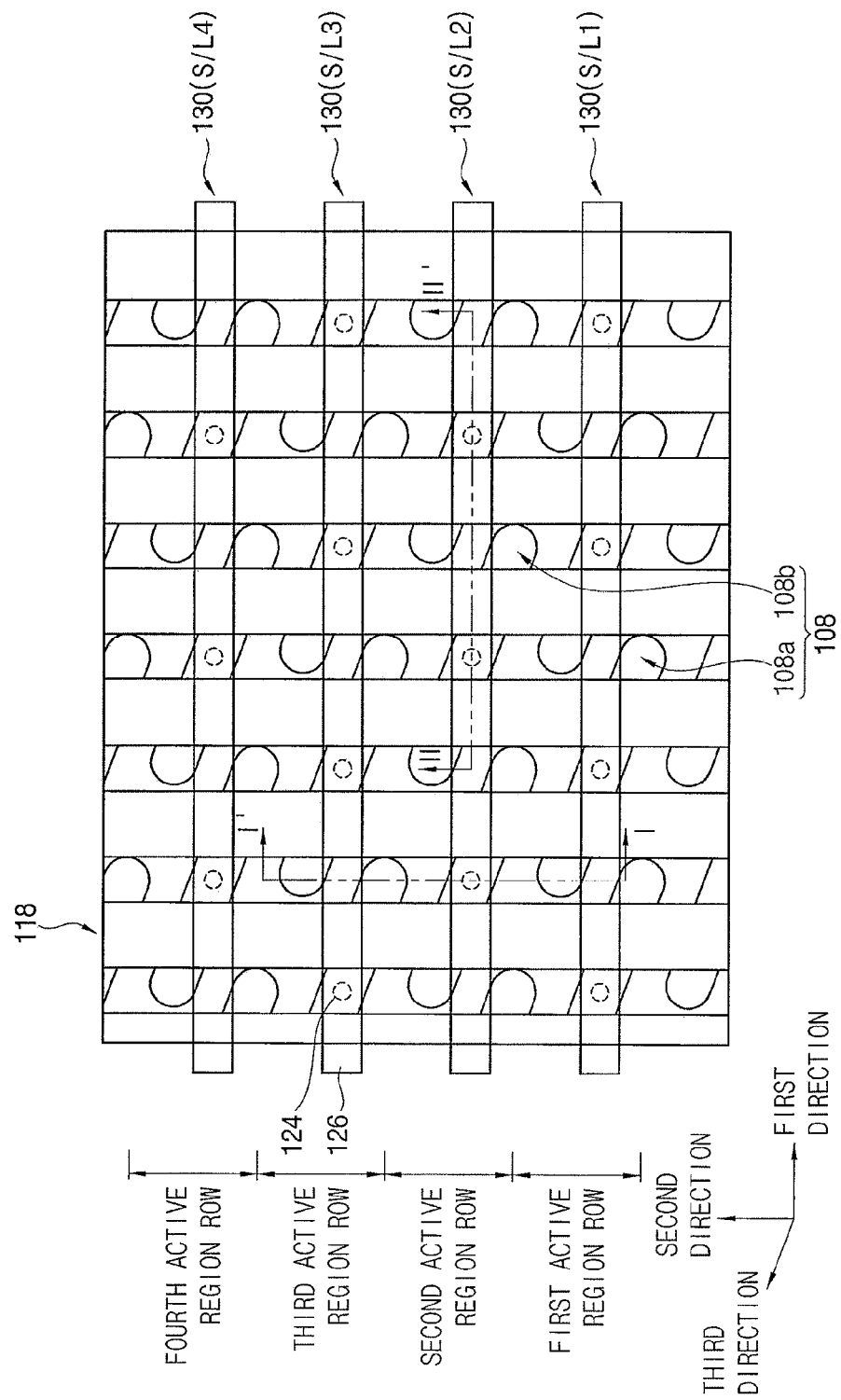

In an implementation, a plurality of source line structures 130 may be arranged on the active patterns 108, as shown in FIG. 9. Hereinafter, the arrangement of the source line structures 130 may be described with reference to FIG. 9.

In an implementation, a first source line structure S/L1 may be formed on the first active patterns 108a of the first active region row, a second source line structure S/L2 may be formed on the second active patterns 108b of the second active region row, and an n-th source line structure may be formed on the first active patterns 108a or the second active regions 108b of the n-th active region row. For example, the transistors on the active patterns 108 of the same active region row may be electrically connected to each other via the source line structure 130.

In an implementation, the active patterns 108 of the same active region row may be arranged in the first direction, and thus each of the source line structures 130 may extend in the first direction.

In an implementation, a spacer 131 may be formed on sidewalls of the source line structure 130.

A second insulating interlayer 132 may be formed on the first insulating interlayer 120 and the source line structures 130.

A contact plug 134 may extend through the first and second insulating interlayers 120 and 132, and may contact drain region of the active pattern 108. The contact plug 134 may include a metal, a metal silicide, a metal nitride, polysilicon, etc.

Figure 11:
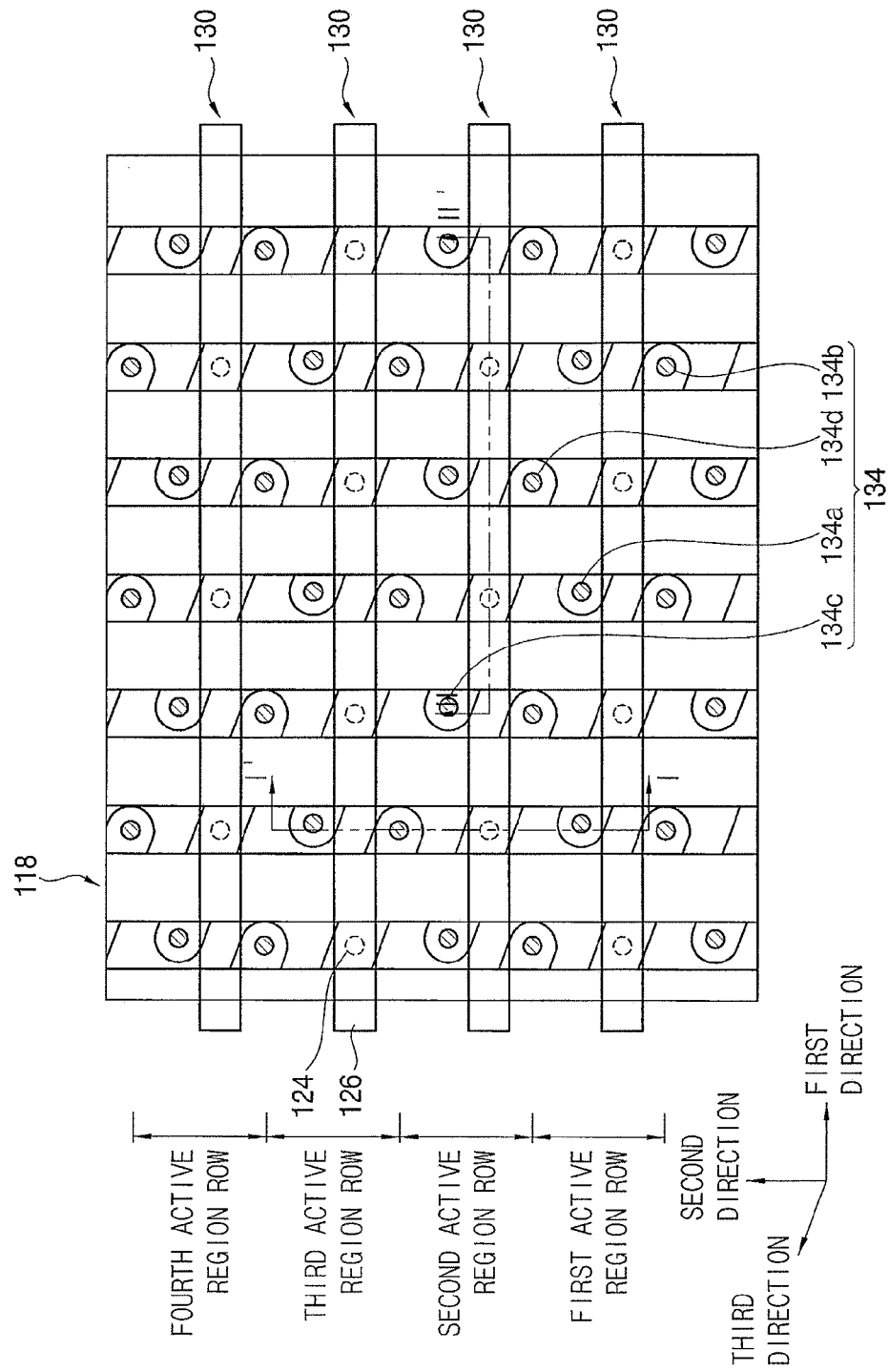

In an implementation, a plurality of contact plugs 134 may contact the drain regions, respectively, as shown in FIG. 11. Hereinafter, the arrangement of the contact plugs 134 may be described with reference to FIG. 11.

The drain regions in each of the first active patterns 108a in the odd-numbered active region rows may be referred to as a first drain region and a second drain region, respectively, and the drain regions in each of the second active patterns 108b in the even-numbered active region rows may be referred to as a third drain region and a fourth drain region, respectively. Each of the first and third drain regions may be formed at an upper portion in the second direction of each of the active patterns 108, and each of the second and fourth drain regions may be formed at a lower portion in the second direction of each of the active patterns 108. For example, a first contact plug 134a, a second contact plug 134b, a third contact plug 134c, and a fourth contact plug 134d may be formed on the first drain region, the second drain region, the third drain region, and the fourth drain region, respectively.

A plurality of pad patterns 138 may be formed on the contact plugs 134, respectively. The pad patterns 138 may include a metal, a metal silicide, a metal nitride, polysilicon, etc.

Figure 13:
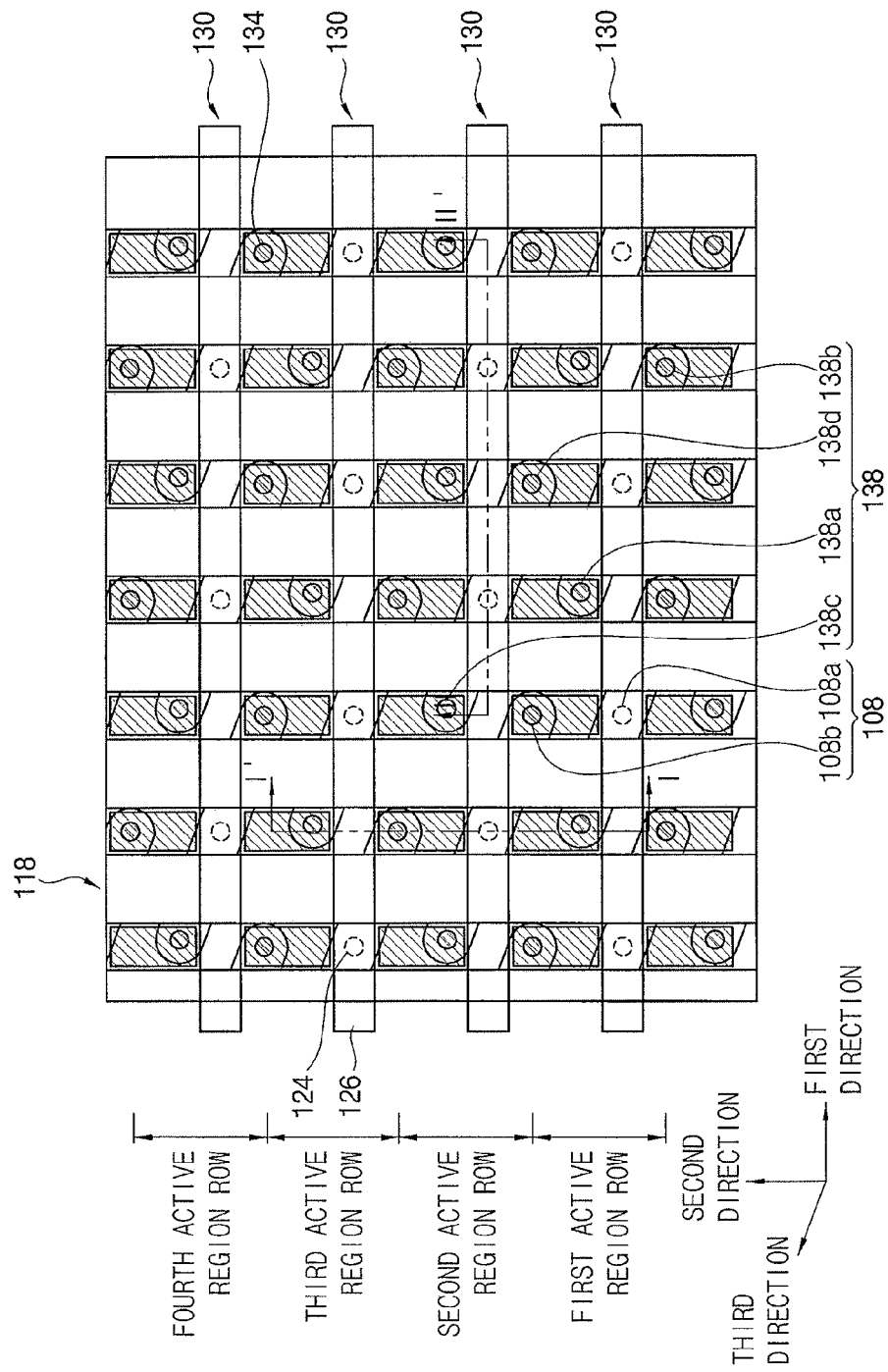

In an implementation, the pad patterns 138 may be formed on the contact plugs 134, as shown in FIG. 13. Hereinafter, the arrangement of the pad patterns 138 may be described with reference to FIG. 13.

Referring to FIG. 13, a first pad pattern 138a, a second pad pattern 138b, a third pad pattern 138c, and a fourth pad pattern 138d may be formed on the first contact plug 134a, the second contact plug 134b, the third contact plug 134c, and the fourth contact plug 134d, respectively. The first to fourth pad patterns 134a, 134b, 134c, and 134d may be formed so that the MTJ structures may be placed on target portions.

The first to fourth pad patterns 138a, 138b, 138c, and 138d may extend in the second direction from the first to fourth contact plugs 134a, 134b, 134c, and 134d, respectively, to overlap respective top surfaces of the isolation layer 106. In an implementation, the first and third pad patterns 138a and 138c may extend from the respective first and third contact plugs 134a and 134c upwardly in the second direction, and the second and fourth pad patterns 138b and 138d may extend from the respective second and fourth pad patterns 138b and 138d downwardly in the second direction.

The first to fourth pad patterns 138a, 138b, 138c, and 138d may be disposed between the gate structures 118, and thus may be aligned in the second direction.

A first insulation pattern 140 may fill a space between the pad patterns 138.

The MTJ structures 150 may be formed on the pad patterns 138, respectively. The MTJ structures 150 may be arranged in various structures.

Figure 15:
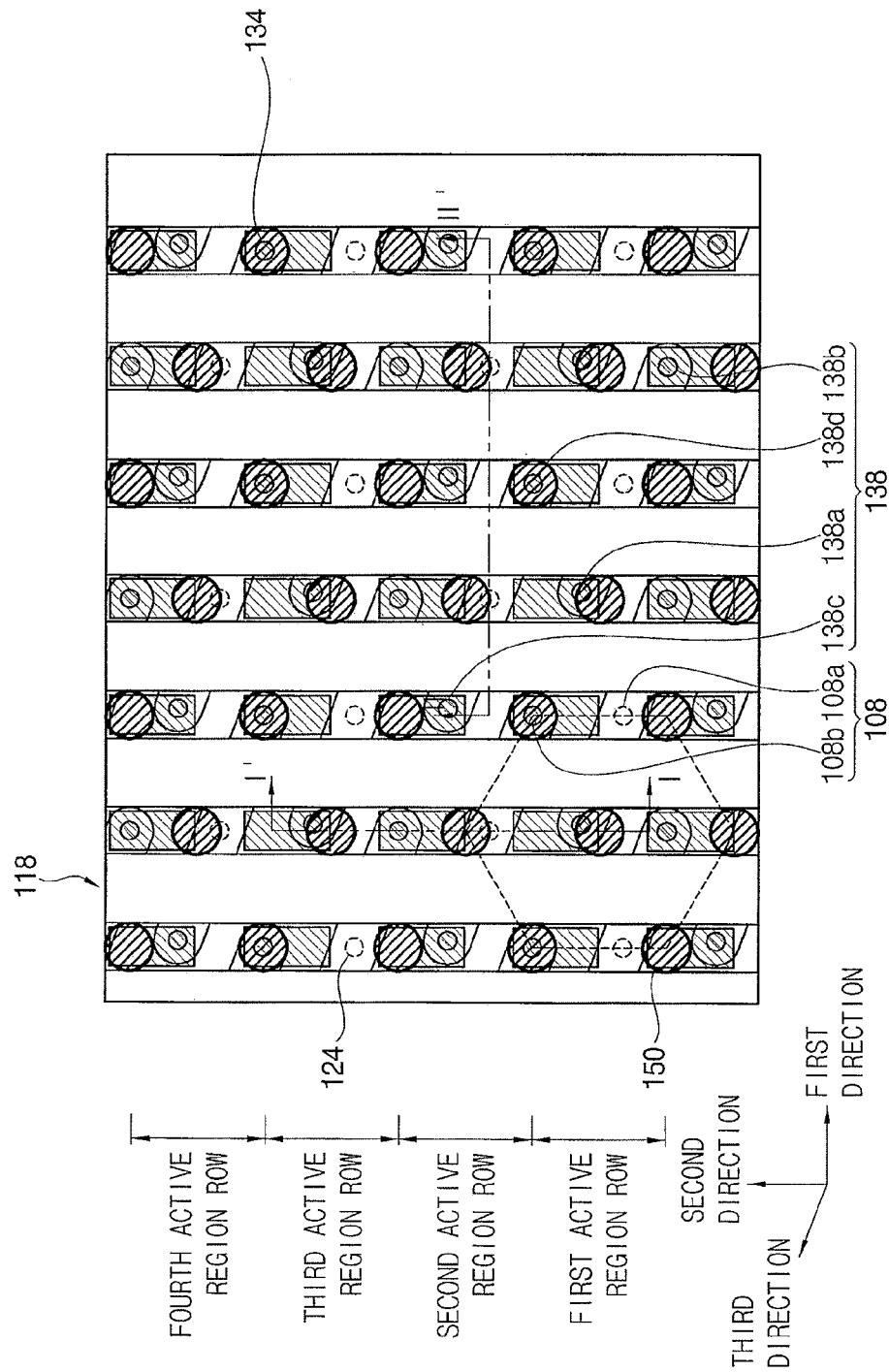

In an implementation, the MTJ structures 150 may be arranged, as shown in FIG. 15. Hereinafter, the arrangement of the MTJ structures may be described with reference to FIG. 15.

Figure 17:
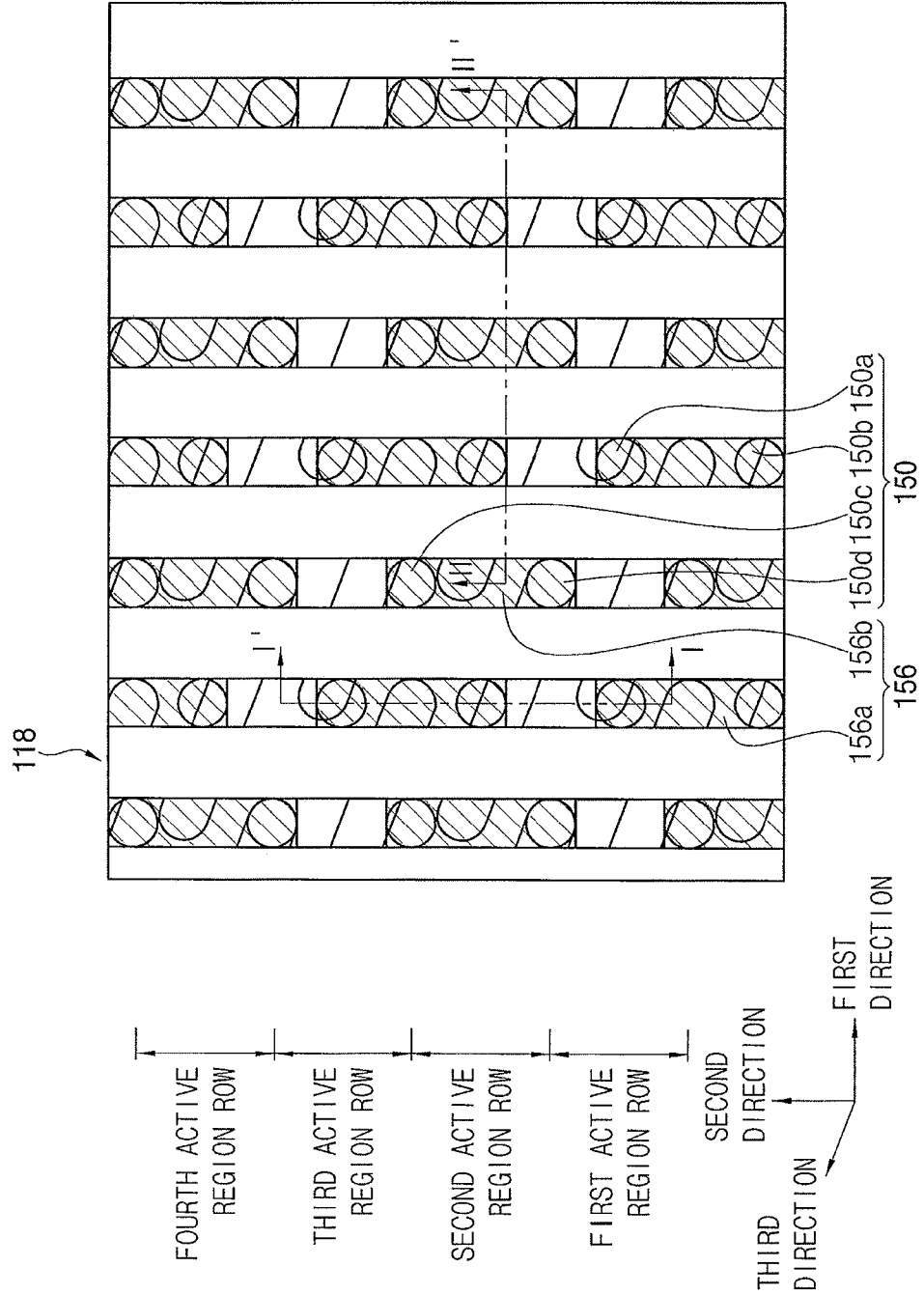

Referring to FIGS. 15 and 17, a first MTJ structure 150a, a second MTJ structure 150b, a third MTJ structure 150c, and a fourth MTJ structure 150d may be formed on the first pad pattern 138a, the second pad pattern 138b, the third pad pattern 138c, and the fourth pad pattern 138d, respectively.

In an implementation, the first MTJ structure 150a may overlap the first drain region. The second MTJ structure 150b may not overlap the second drain region, and may overlap the isolation layer 106. The third MTJ structure 150c may not overlap the third drain region, and may overlap the isolation layer 106. The fourth MTJ structure 150d may overlap the fourth drain region.

In an implementation, the MTJ structures 150 may be disposed between the gate structures 118, and thus may be arranged in or along the second direction.

In an implementation, the arrangement of the MTJ structures 150 may have a honeycomb structure. For example, in the honeycomb structure, the MTJ structures 150 may be disposed at vertices and centers of hexagons, and thus distances between neighboring ones of the MTJ structures 150 may be substantially the same as each other. For example, disturbance between the MTJ structures 150 may advantageously decrease, and the MTJ structures 150 may be easily formed by a patterning process.

In an implementation, the arrangement of the MTJ structures 150 may have a rhombus structure. For example, in the rhombus structure, the MTJ structures 150 may be disposed at vertices of rhombuses.

In an implementation, the MTJ structure 150 may include a sequentially stacked lower electrode 142, MTJ pattern structure 144, and upper electrode 146.

The lower and upper electrodes 142 and 146 may include a metal, e.g., tungsten, titanium, tantalum, etc., and/or a metal nitride, e.g., tungsten nitride, titanium nitride, tantalum nitride, etc. In an implementation, the upper electrode 146 may include tungsten.

The MTJ pattern structure 144 may include a first magnetic layer, a tunnel barrier layer, and a second magnetic layer.

The first magnetic layer may include a pinning layer, a lower ferromagnetic layer, an anti-ferromagnetic coupling spacer and an upper ferromagnetic layer. The pinning layer may include, e.g., FeMn, IrMn, PtMn, MnO, MnS, MnTe, $MnF_2$, $FeF_2$, $FeCl_2$, FeO, $CoCl_2$, CoO; $NiCl_2$, NiO, and/or Cr. The lower and upper ferromagnetic layers may include, e.g., Fe, Ni, and/or Co. The anti-ferromagnetic coupling spacer layer may include, e.g., Ru, Ir, and/or Rh.

The tunnel barrier layer may include, e.g., aluminum oxide or magnesium oxide.

The second magnetic layer may serve as a free layer. In this case, the second magnetic layer may include a ferromagnetic material including Fe, Co, Ni or the like.

Compositions of the MTJ structure 150 may not be limited to the above, and various modifications may be possible.

A second insulation pattern 154 may fill a space between the MTJ structures 150.

A bit line structure 164 may be electrically connected with the MTJ structures 150 sharing the source line structure 130. The bit line structure 164 may extend in the first direction, and a plurality of bit line structures 164 may be repeatedly arranged in or along the second direction.

In an implementation, the bit line structure 164 may include a lower bit line 156, a bit line contact 160, and an upper bit line 162.

Figure 19:
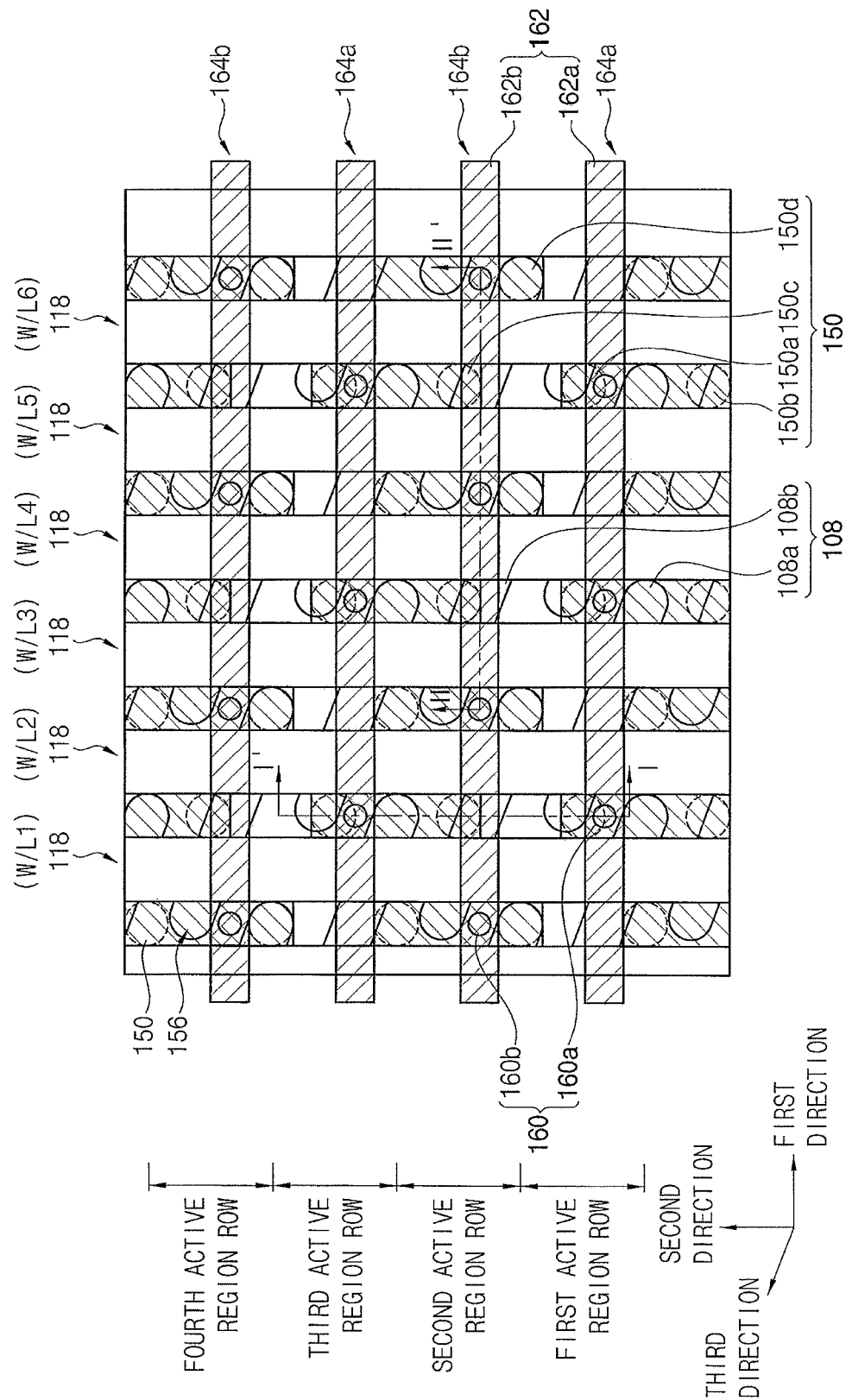

In an implementation, the bit line structures 164 may be arranged as shown in FIGS. 17 and 19. Hereinafter, the arrangement of the bit line structures 164 may be described with reference to FIGS. 17 and 19.

A first bit line structure 164a may be electrically connected with the first and second MTJ structures 150a and 150b, which may be formed on the first active patterns 108a of each of the odd-numbered active region rows and disposed in the first direction. A second bit line structure 164b may be electrically connected with the third and fourth MTJ structures 150c and 150d, which may be formed on the second active patterns 108b of each of the even-numbered active region rows and disposed in the first direction.

The first bit line structure 164a may include a first lower bit line 156a, a first bit line contact 160a, and a first upper bit line 162a. The second bit line structure 164b may include a second lower bit line 156b, a second bit line contact 160b, and a second upper bit line 162b.

The first lower bit line 156a may be electrically connected with the first and second MTJ structures 150a and 150b on neighboring ones of the first active patterns 108a in the respective odd-numbered active region rows in the first direction. The first lower bit line 156a may extend in the second direction to a given length, and a plurality of first lower bit lines 156a may be disposed between the gate structures 118.

The first bit line contact 160a may contact the first lower bit line 156a. A plurality of first bit line contacts 160a may be arranged in (e.g., spaced apart along) the first direction.

The first upper bit line 162a may extend in the first direction, and may contact the first bit line contacts 160a arranged in the first direction.

The second lower bit line 156b may be electrically connected with the third and fourth MTJ structures 150c and 150d on neighboring ones of the second active patterns 108b in the respective even-numbered active region rows in the first direction. The second lower bit line 156b may have an island shape. The second lower bit line 156b may extend in the second direction to a given length, and a plurality of second lower bit lines 156b may be disposed between the gate structures 118.

The second bit line contact 160b may contact the second lower bit line 156b. A plurality of second bit line contacts 160b may be arranged in (e.g., spaced apart along) the first direction.

The second upper bit line 162b may extend in the first direction, and may contact the second bit line contacts 160b arranged in the first direction.

An upper insulating interlayer 158 may be formed between the bit line structures 164.

As described above, the first and second MTJ structures 150a and 150b on the first active patterns 108a of the odd-numbered active region rows may be electrically connected by the first bit line structure 164a. The third and fourth MTJ structures 150c and 150d on the second active patterns 108b of the even-numbered active region rows may be electrically connected by the second bit line structure 164b.

For example, the MTJ structures 150 on the active patterns 108 of the same active region row may be electrically connected to each other via one of the bit line structures 164. Also, the source regions on the active patterns 108 of the same active region row may be electrically connected to each other via one of the source line structures 130. Thus, the numbers of the bit line structure 164 and the source line structure 130 may be same as each other, and the bit line structure 164 and the source line structure 130 may be arranged in pair. For example, one bit line structure 164 may be paired with one source line structure 130.

The bit line structure 164 may include a metal nitride and/or a metal. The metal nitride may include, e.g., tungsten nitride, titanium nitride, tantalum nitride, etc., and the metal may include, e.g., tungsten, aluminum, copper, etc.

In an implementation, a fourth hard mask 170 may be formed on the bit line structure 164. The fourth hard mask 170 may include, e.g., silicon nitride.

An additional insulating interlayer may be further formed on the upper insulating interlayer 158 to cover the bit line structures 164.

As described above, in the MRAM device, the source line structure 130 and the bit line structure 164 may be shared by a plurality of memory cells on the active patterns 108 of the same active region row. The gate structures 118 may extend in the second direction. Different gate structures 118 may be formed on each of the active patterns 108 of the same active region row. One gate structure 118 may be formed on neighboring ones of the active patterns 108 of the respective odd-numbered and even-numbered active region rows, and thus may be shared thereby.

In the MRAM device, the memory cells that share the word lines may be electrically connected with different bit line structures 164, respectively. Thus, one memory cell may be selected by the word line and the bit line structure 164.

In the MRAM device, the numbers of the bit line structure 164 and the source line structure 130 may be same as each other, and the bit line structure 164 and the source line structure 130 may be arranged in pairs. Thus, the MRAM device may have a high integration degree, and an operating voltage for data writing may be lowered.

In an implementation, the MTJ structures 150 may be arranged in the honey comb structure or the rhombus structure. Thus, disturbance or interference between the MTJ structures 150 may decrease, and many memory cells may be formed in a narrow area.

Figure 3:
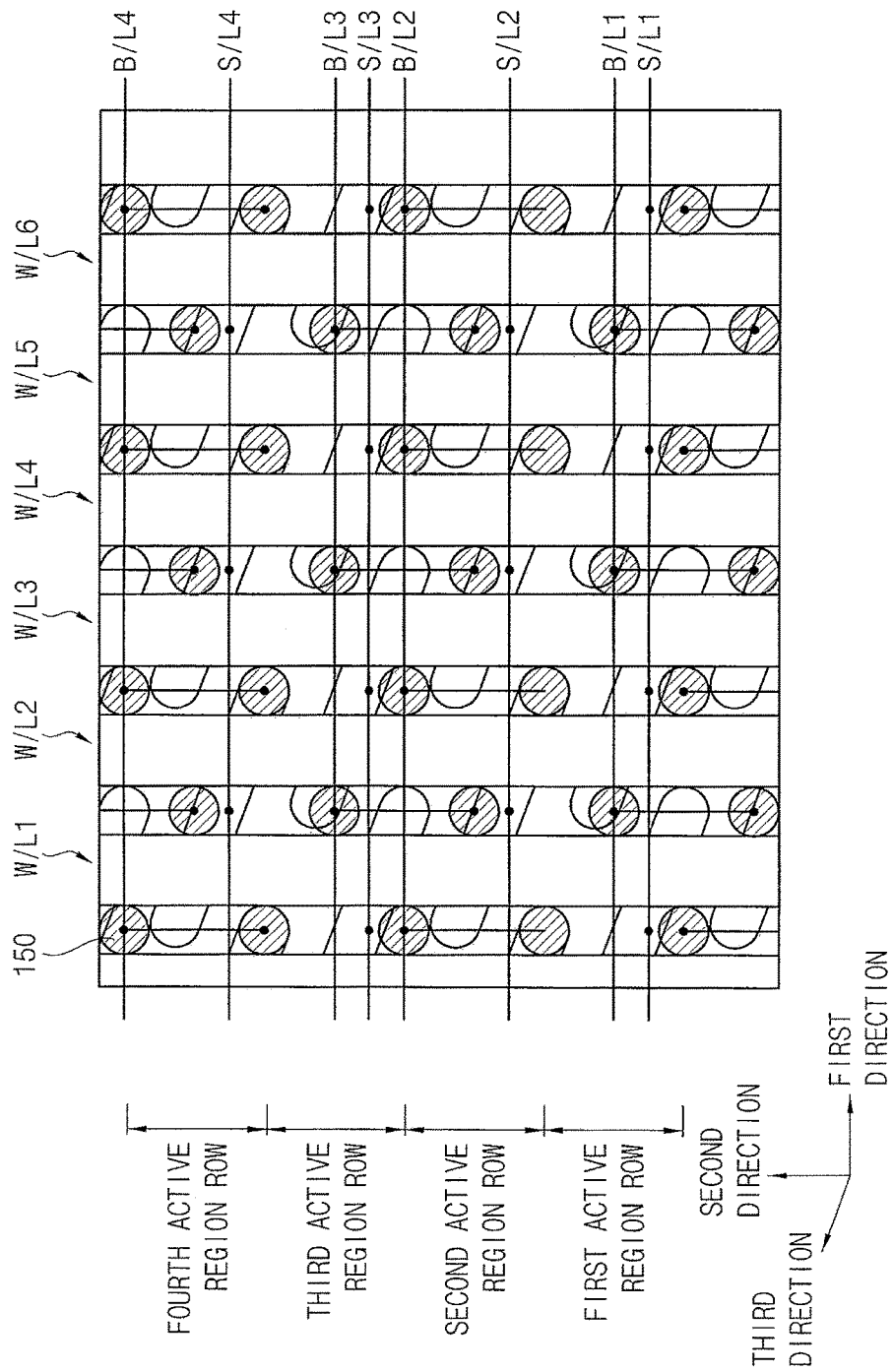
FIG. 3 illustrates a schematic plan view of a connection of elements in the MRAM device in accordance with example embodiments.
Figure 4:
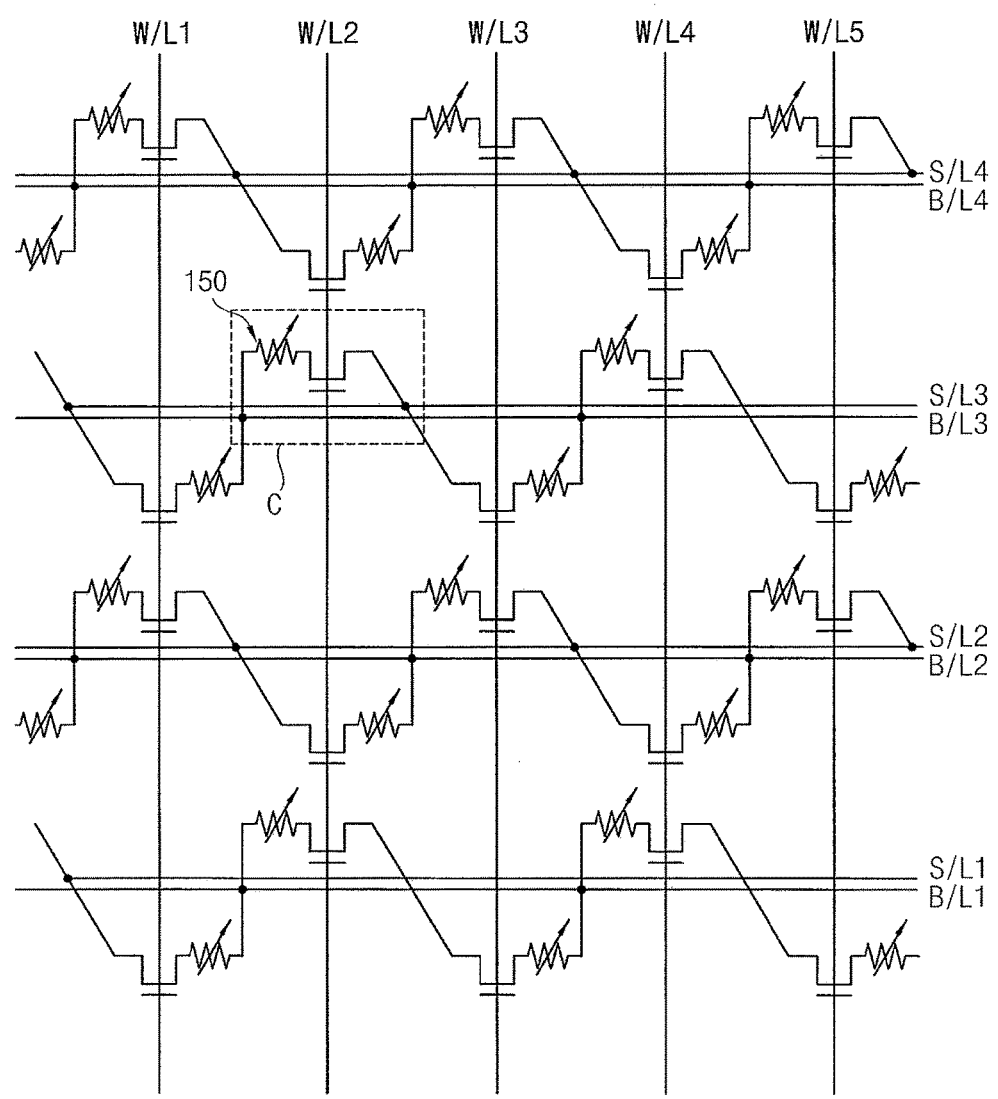
FIG. 4 illustrates an equivalent circuit of the MRAM device in accordance with example embodiments.

FIG. 3 illustrates a schematic plan view of the connection between elements in the MRAM device in accordance with example embodiments. FIG. 4 illustrates an equivalent circuit of the MRAM device in accordance with example embodiments.

Hereinafter, a method of selecting a memory cell C in FIG. 4 and a method of writing a data therein may be described.

Referring to FIGS. 3 and 4, the second word line W/L2 of a second word line column may be selected. Thus, a signal may be applied to the gate electrodes 114 via the second word line W/L2, so that transistors that shares the second word line W/L2 may be turned on. For example, the memory cells C on the active patterns 108 arranged in the second direction may be selected.

Also, the third source line structure S/L3 of a third source line structure row may be selected. Thus, a signal may be applied to the source regions arranged in the first direction on the active patterns 108 of the third active region row via the third source line structure S/L3.

Thus, a memory cell C at a cross-point of the second word line W/L2 and the third source line structure S/L3 may be selected, and an electrical signal may be applied to the MTJ structure 150 of the selected memory cell C. Also, the electrical signal may be applied to the third bit line structure B/L3 in the selected memory cell C via the MTJ structure 150.

Data may be written in the selected memory cell C, and the method of writing the data may be described.

The selected memory cell C may include the third source line structure S/L3 and the third bit line structure B/L3 in a pair. Thus, when a voltage difference between the third source line structure S/L3 and the third bit line structure B/L3 is greater than a writing voltage, which may be a minimum voltage for a cell state transition, a data may be written in the selected memory cell C.

In an implementation, the writing voltage may be applied to the third bit line structure B/L3, and 0V may be applied into the third source line structure S/L3. Thus, a current may flow in a direction from the third bit line structure B/L3 to the third source line structure S/L3, so that data 0 may be written in the selected memory cell C.

In an implementation, the writing voltage may be applied to the third source line structure S/L3, and 0V may be applied to the third bit line structure B/L3. Thus, a current may flow in a direction from the third source line structure S/L3 to the third bit line structure B/L3, so that data 1 may be written in the selected memory cell C.

For example, data, e.g., a 0 or 1, may be written in the selected memory cell C according to a direction of the current.

In the MRAM device, when data 0 or 1 is written in the selected memory cell C, the writing voltage may be applied to one of the bit line structure and the source line structures. For example, the writing voltage may be alternately applied to the bit line structure and the source line structure according to a writing data. Thus, the writing voltage may be lowered.

In some other devices, the source line structure may be commonly used in all memory cells. In this case, when data 0 or 1 is written in the selected memory cell, the writing voltage may not be alternately applied to one of the bit line structure and the source line structure, and a reference voltage and an operating voltage may be applied to the source line structure and the bit line structure, respectively. For example, a reference voltage that is higher than the writing voltage may be applied to the source line structure, and the operating voltage higher or lower than the reference voltage by the writing voltage may be applied to the bit line structure. Thus, the operating voltage for writing may be high.

FIGS. 5 to 20 illustrate plan views and cross-sectional views stages in a method of manufacturing an MRAM device in accordance with example embodiments.

FIGS. 6, 8, 10, 12, 14, 16, 18 and 20 illustrate cross-sectional views taken along lines I-I' and II-II' of corresponding plan views, respectively.

Figure 6:
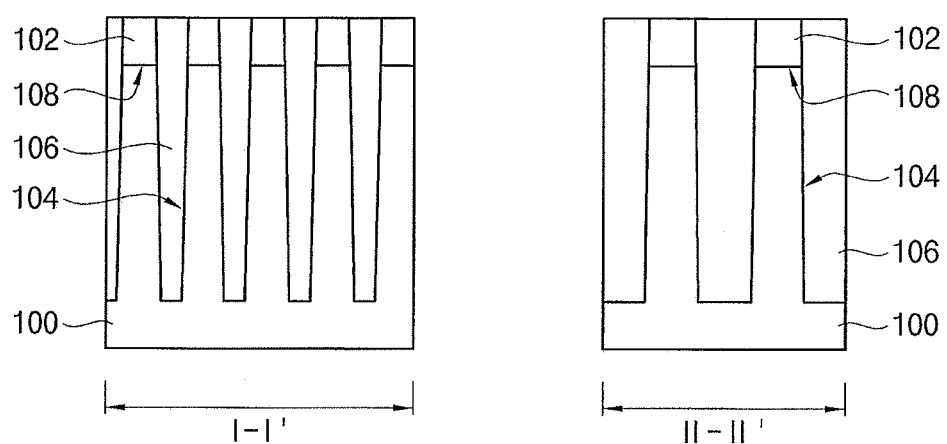

Referring to FIGS. 5 and 6, a first hard mask 102 may be formed a substrate 100. An upper portion of the substrate 100 may be etched using the first hard mask 102 as an etching mask to form a first trench 104.

The substrate 100 may include a semiconductor material, e.g., silicon, germanium, silicon-germanium, etc., or III-V semiconductor compounds, e.g., GaP, GaAs, GaSb, etc. In an implementation, the substrate 100 may be a silicon-on-insulator (SOI) substrate, or a germanium-on-insulator (GOI) substrate. The first hard mask 102 may be formed of a nitride, e.g., silicon nitride.

An insulation layer may be formed on the substrate 100 to fill the first trench 104. The insulation layer may be planarized until an upper surface of the substrate 100 may be exposed to form an isolation layer 106 in the first trench 104. The insulation layer 106 may be formed of an oxide, e.g., silicon oxide. Thus, an active pattern 108 on which no isolation layer is formed may be defined.

In an implementation, a plurality of active patterns 108 may be formed to be spaced apart from each other, and each of the active patterns 108 may extend in the third direction.

In an implementation, the arrangement of the first active patterns 108 may be substantially the same as that illustrated with reference to FIG. 1.

For example, the active patterns 108 may be formed in the first direction, and may include first and second active patterns 108a and 108b in odd-numbered and even-numbered active region rows, respectively. The second active patterns 108b of the respective even-numbered active region rows may not be aligned linearly with the first active patterns 108a of the respective odd-numbered rows, e.g., the active patterns of adjacent rows may be offset relative to one another. The first and second active patterns 108a and 108b of the odd-numbered and even-numbered active region rows may be inclined, e.g., may be disposed to have an acute angle with respect to the first direction or the second direction.

Impurities may be doped into upper portions of the substrate 100 to form impurity regions. The impurity regions may serve as source/drain regions of a transistor.

Figure 8:
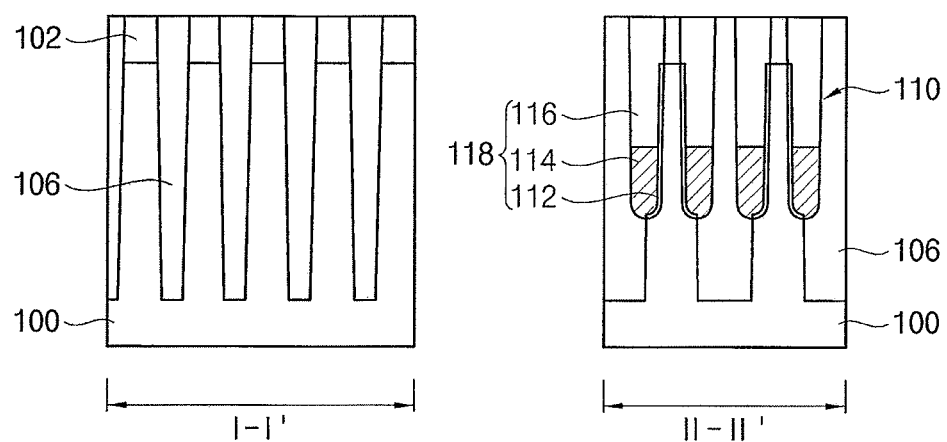

Referring to FIGS. 7 and 8, the first hard mask 102, the substrate 100, and the isolation layer 106 may be partially etched to form a second trench 110 extending in the second direction. In an implementation, the substrate 100 and the isolation layer 106 may have different etching rates from each other, so that the second trench 110 may have different depths according to the position thereof. In an implementation, two second trenches 110 may be formed at each of the active patterns 108.

A gate insulation layer 112 may be formed on the substrate 100 having the second trench 110 thereon. A gate electrode 114 and a capping pattern 116 may be formed to fill a lower portion and an upper portion of the second trench 110, respectively. In an implementation, the gate insulation layer 112 may be formed by a thermal oxidation process, a chemical vapor deposition (CVD) process, or the like. The gate insulation layer 112 may be formed of an oxide, e.g., silicon oxide.

The gate electrode 114 may be formed on the gate insulation layer 112 in the lower portion of the second trench 110 by forming a gate electrode layer on the gate insulation layer 112, the first hard mask 102 and the isolation layer 106 to fill the second trench 110, and removing an upper portion of the gate electrode layer. The removing process may be performed by a chemical mechanical polishing (CMP) process and/or an etch back process. The gate electrode layer may be formed of a metal, e.g., tungsten, titanium, tantalum, etc., and/or a metal nitride, e.g., tungsten nitride, titanium nitride, tantalum nitride, etc.

The capping pattern 116 may be formed on the gate electrode 114 in the upper portion of the second trench 110 by forming a capping layer on the gate electrode 114, the gate insulation layer 112 and the first hard mask 102 to fill the second trench 110, and planarizing an upper portion of the capping layer until an upper surface of the isolation layer 106 may be exposed. The capping layer may be formed of a nitride, e.g., silicon nitride.

Thus, a gate structure 118 including the sequentially stacked gate insulation layer 112, gate electrode 114, and capping pattern 116 may be formed. In an implementation, the gate structure 118 may extend in the second direction. The gate electrode 114 may serve as a word line of the MRAM device.

Two word lines may be formed on each of the active patterns 108. Thus, two transistors sharing the source region may be formed on each of the active patterns 108.

In an implementation, the arrangement of the word lines may be substantially the same as that illustrated with reference to FIG. 1.

For example, different word lines may be formed on different active patterns 108, respectively, in each of the active region rows. One word line may be commonly formed on the first and second active patterns 108a and 108b in the odd-numbered and even-numbered active region rows, respectively, and thus the word line may be shared thereby.

Figure 10:
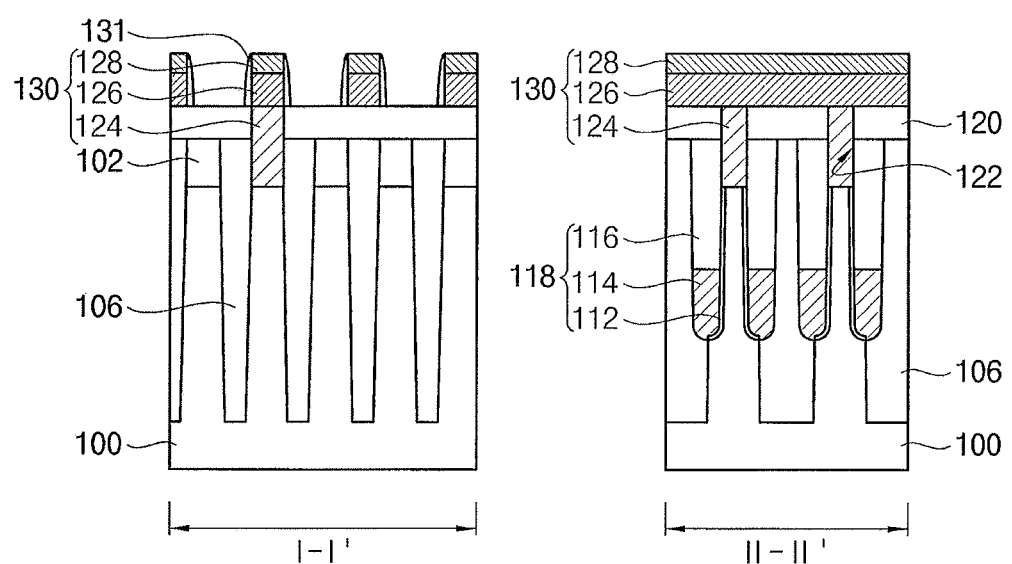

Referring to FIGS. 9 and 10, a source line structure 130 may be formed on the source region, which may be disposed at a central upper portion of each of the active patterns 108. The source line structure 130 may be electrically connected to the source region, and may extend in the first direction.

In an implementation, the source line structure 130 may include a sequentially stacked source contact plug 124, source line 126, and second hard mask 128.

For example, a first insulating interlayer 120 may be formed on the first hard mask 102, the isolation layer 106, and the capping pattern 116. The first insulating interlayer 120 and the first hard mask 102 may be partially etched to form a first contact hole 122 exposing the source region of each of the active patterns 108. In an implementation, when the first contact hole 122 is formed, the capping pattern 116 and the isolation layer 106 may be partially etched.

A conductive layer may be formed on the first insulating interlayer 120 to fill the first contact hole 122. The conductive layer may include a barrier layer and a first metal layer. The barrier layer may include a metal nitride, e.g., tungsten nitride, titanium nitride, tantalum nitride, etc., and the first metal layer may include a metal, e.g., tungsten, aluminum, copper, etc. In an implementation, the conductive layer may include doped polysilicon.

The second hard mask 128 may be formed on the conductive layer. The second hard mask 128 may be formed of a nitride, e.g., silicon nitride.

The conductive layer may be etched using the second hard mask 128 as an etching mask to form the source line structure 130 including the source contact plug 124, the source line 126 and the second hard mask 128. The source contact plug 124 may be formed in the first contact hole 122. The source line 126 may be formed on the first insulating interlayer 120 to contact the source contact plug 124.

In an implementation, the source line structure 130 may be formed by forming the source contact plug 124 to fill the first contact hole 122, forming a conductive layer and a second hard mask 128 on the source contact plug 124 and the first insulating interlayer 120, and patterning the conductive layer using the second hard mask 128 as an etching mask. Thus, the source line structure 130 may include the source contact plug 124, the source line 126 and the second hard mask 128.

A spacer 131 may be formed on sidewalls of the source line structure 130. The spacer 131 may be formed of a nitride, e.g., silicon nitride.

Figure 12:
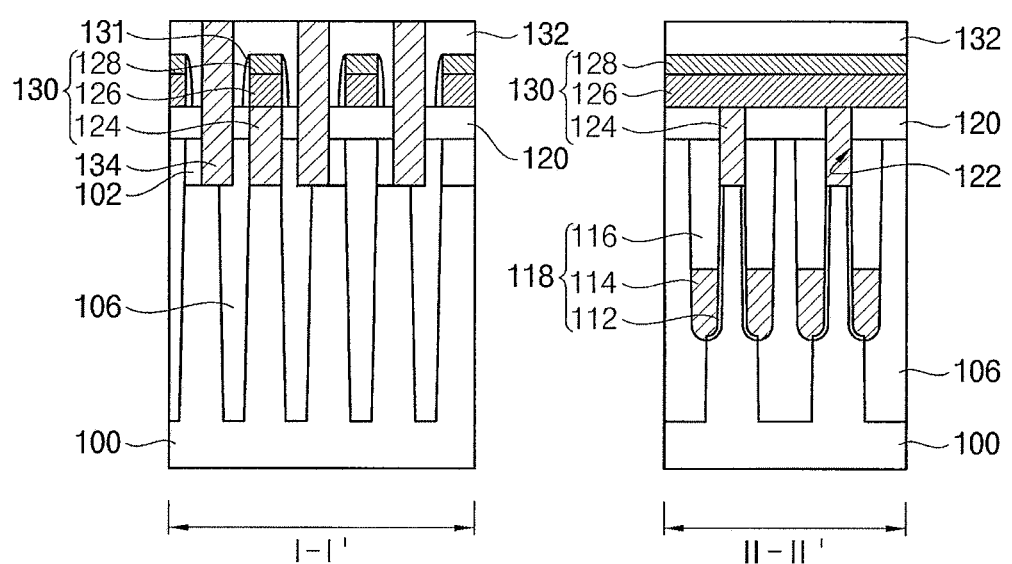

Referring to FIGS. 11 and 12, a second insulating interlayer 132 may be formed on the first insulating interlayer 120 to cover the source line structure 130. The second insulating interlayer 132, the first insulating interlayer 120 and the first hard mask 102 may be partially etched to form a second contact hole exposing a drain region of each of the active patterns 108.

A contact plug 134 may be formed to fill the second contact hole. In an implementation, the contact plug 134 may be formed by forming a conductive layer to fill the second contact hole, and planarizing an upper portion of the conductive layer until an upper surface of the second insulating interlayer 132 may be exposed. The conductive layer may be formed of a metal, a metal silicide, or doped poly silicon, etc.

For example, opposite edge portions in the third direction of the first active patterns 108a of the odd-numbered active region rows may serve as first and second drain regions, respectively. The first drain region may be disposed at an upper portion in the second direction, and the second drain region may be disposed at a lower portion in the second direction. A first contact plug 134a may be formed on the first drain region, and a second contact plug 134b may be formed on the second drain region.

Opposite edge portions in the third direction of the second active patterns 108b of the even-numbered active region row may serve as third and fourth drain regions, respectively. The third drain region may be disposed at an upper portion in the second direction, and the fourth drain region may be disposed at a lower portion in the second direction. A third contact plug 134c may be formed on the third drain region, and a fourth contact plug 134b may be formed on the fourth drain region.

Figure 14:
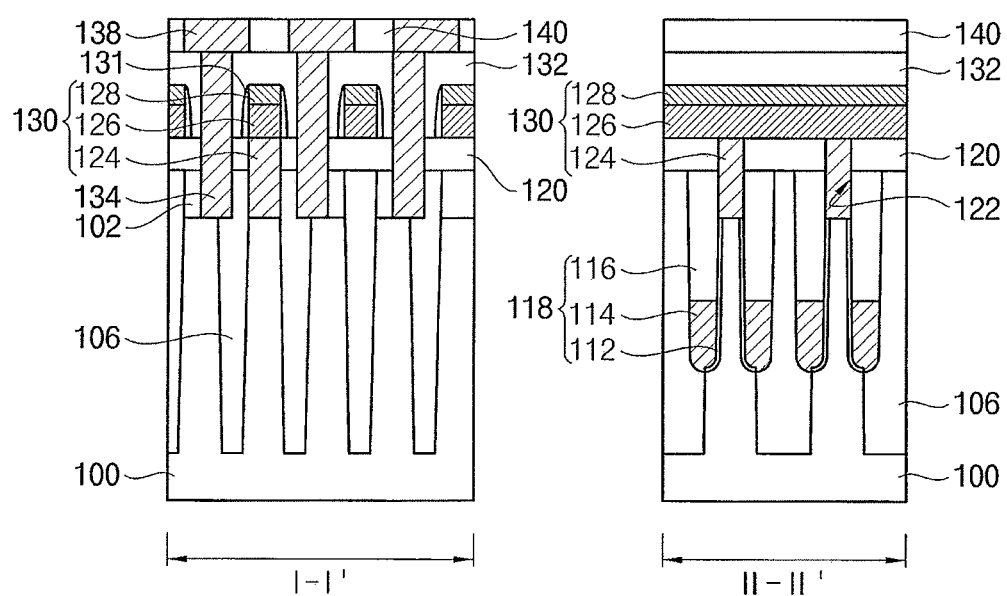

Referring to FIGS. 13 and 14, a second conductive layer may be formed on the contact plug 134 and the second insulating interlayer 132. The second conductive layer may be formed of a metal, e.g., tungsten, aluminum, copper, etc. The second conductive layer may be patterned to form a pad pattern 138 contacting the contact plug 134.

In an implementation, a first pad pattern 138a, a second pad pattern 138b, a third pad pattern 138c, and a fourth pad pattern 138d may be formed on the first contact plug 134a, the second contact plug 134b, the third contact plug 134c, and the fourth contact plug 134d, respectively. Each of the first to fourth pad patterns 138a, 138b, 138c, and 138d may be formed so that the MTJ structures may be formed at desired positions. The first to fourth pad patterns 138a, 138b, 138c, and 138d may include a metal, a metal silicide, or doped polysilicon, etc.

The first to fourth pad patterns 138a, 138b, 138c, and 138d may extend in the second direction from the respective first to fourth contact plugs 134a, 134b, 134c, and 134d to overlap portions of the isolation layer 106. In an implementation, each of the first to fourth pad patterns 138a, 138b, 138c, and 138d may be formed to overlap a portion of the isolation layer 106 between the gate structures 118. Thus, the first to fourth pad patterns 138a, 138b, 138c, and 138d may be formed in the second direction. In an implementation, the first to fourth pad patterns 138a, 138b, 138c, and 138d may be formed in the first direction.

A first insulation pattern 140 may be formed to fill spaces between the first to fourth pad patterns 138a, 138b, 138c, and 138d. The first insulation pattern 140 may be formed of silicon nitride or silicon oxide.

In an implementation, the first to fourth pad patterns 138a, 138b, 138c, and 138d may be formed by a damascene process. For example, the first insulation pattern 140 including openings therethrough may be formed, and a second conductive layer may be formed on the first insulation pattern 140 to fill the openings. The second conductive layer may be planarized until an upper surface of the first insulation pattern 140 may be exposed to form the first to fourth pad patterns 138a, 138b, 138c, and 138d.

FIGS. 15, 17, and 19 do not show the source line structure 130 for simplicity.

Figure 16:
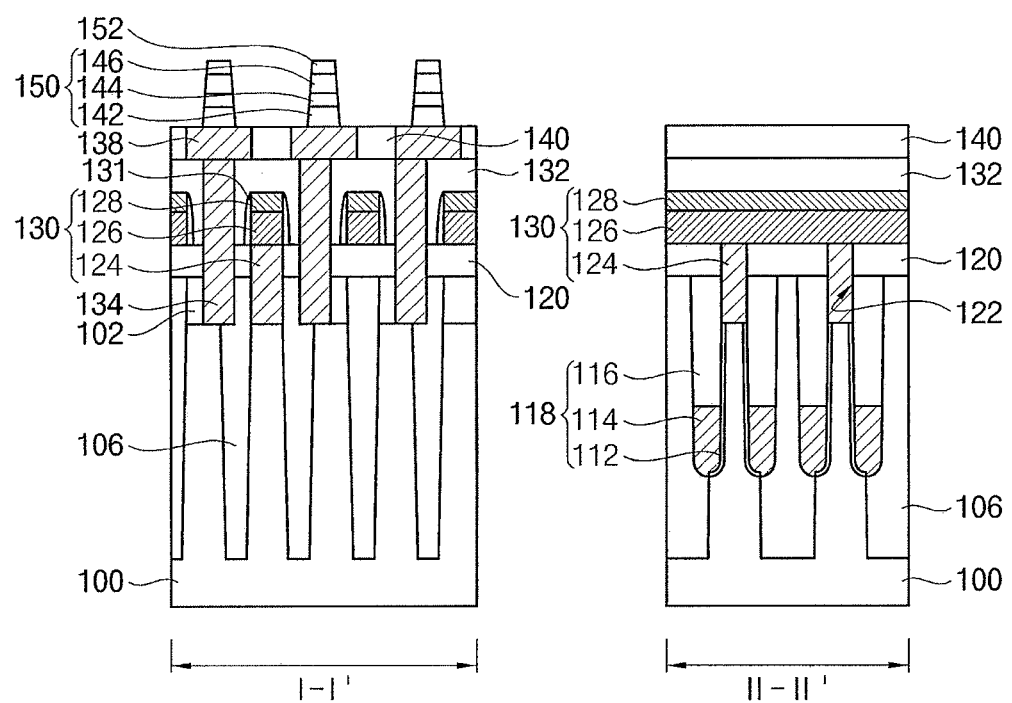

Referring to FIGS. 15 and 16, a plurality of MTJ structures 150 may be formed on the pad patterns 138, respectively. The MTJ structures 150 may be spaced apart from each other.

The MTJ structure 150 may include a sequentially stacked lower electrode 142, MTJ pattern structure 144, and upper electrode 146. A third hard mask 152 may be formed on the MTJ structure 150.

For example, a lower electrode layer, an MTJ layer, and an upper electrode layer may be sequentially formed on the first insulation pattern 140 and the pad patterns 138. The third hard mask 152 may be formed on the upper electrode layer.

The lower and upper electrode layers may be formed of a metal, e.g., tungsten, titanium, tantalum, etc., and/or a metal nitride, e.g., tungsten nitride, titanium nitride, tantalum nitride, etc. In an implementation, the upper electrode layer may include tungsten.

The MTJ layer may include a first magnetic layer, a tunnel barrier layer, and a second magnetic layer.

The first magnetic layer may include a pinning layer, a lower ferromagnetic layer, an anti-ferromagnetic coupling spacer, and an upper ferromagnetic layer. The pinning layer may be formed of, e.g., FeMn, IrMn, PtMn, MnO, MnS, MnTe, $MnF_2$, $FeF_2$, $FeCl_2$, FeO, $CoCl_2$, CoO, $NiCl_2$, NiO, and/or Cr. The lower and upper ferromagnetic layers may be formed of, e.g., Fe, Ni, and/or Co. The anti-ferromagnetic coupling spacer layer may be formed of, e.g., Ru, Ir, and/or Rh.

The tunnel barrier layer may be formed of, e.g., aluminum oxide or magnesium oxide.

The second magnetic layer may serve as a free layer. In this case, the second magnetic layer may be formed of a ferromagnetic material including Fe, Co, Ni or the like.

The third hard mask 152 may be formed of, e.g., silicon nitride.

The upper electrode layer may be etched using the third hard mask 152 as an etching mask to form the upper electrode 146.

The MTJ layer and the lower electrode layer may be sequentially etched using the upper electrode as an etching mask to form the MTJ structure 150 including the sequentially stacked lower electrode 142, MTJ pattern structure 144, and upper electrode 146.

For example, a first MTJ structure 150a, a second MTJ structure 150b, a third MTJ structure 150c, and a fourth MTJ structure 150d may be formed on the first pad pattern 138a, the second pad pattern 138b, the third pad pattern 138c, and the fourth pad pattern 138d, respectively. Each of the MTJ structures 150 may contact at least a portion of an upper surface of each of the pad patterns, and a degree of freedom of the arrangement of the MTJ structures 150 may increase.

In an implementation, the arrangement of the first to fourth MTJ structures 150a, 150b, 150c, and 150d may be substantially the same as that illustrated with reference to FIG. 1.

For example, the arrangement of the MTJ structures 150 may have the honey comb structure. In this case, distances between neighboring ones of the MTJ structures 150 may be substantially the same as each other. Thus, defects such as etching residues on sidewalls of the MTJ structures 150 may decrease during an etching process for forming the MTJ structures 150.

When the MTJ structures 150 are formed, the etching loading of MTJ structures 150 may be uniform, so that the MTJ structures 150 may have a uniform size.

In an implementation, the arrangement of the MTJ structures 150 may have the rhombus structure. For example, the MTJ structures 150 may be disposed at vertices of rhombuses.

In an implementation, the capping layer may be conformally formed on the first insulation pattern 140 and the MTJ structures 150. The capping layer may be formed of, e.g., silicon nitride.

FIGS. 17 and 19 do not show the pad patterns for simplicity.

Figure 18:
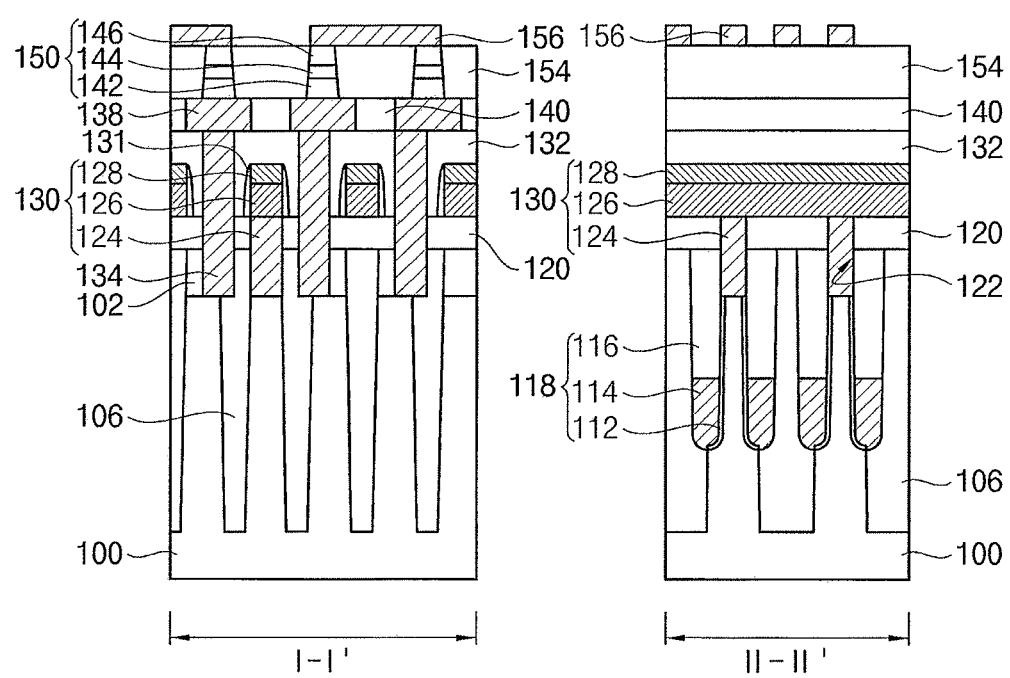

Referring to FIGS. 17 and 18, a second insulation layer may be formed on the first insulation pattern 140 to fill spaces between the MTJ structures 150. An upper portion of the second insulation layer may be planarized to form a second insulation pattern 154 between the MTJ structures 150. When the second insulation pattern 154 is formed, the third hard mask 152 and the capping layer may be removed together. Thus, an upper surface of the upper electrodes 146 in the MTJ structures 150 may be exposed.

A conductive layer may be formed on the second insulation pattern 154 and the MTJ structures 150. The conductive layer may be patterned to form a plurality of lower bit lines 156.

The lower bit lines 156 may have a connection structure substantially the same as that illustrated with reference to FIG. 1.

For example, the first lower bit line 156a may be electrically connected with the first and second MTJ structures 150a and 150b on neighboring ones of the first active patterns 108a in the respective odd-numbered active region rows in the first direction. The second lower bit line 156b may be electrically connected with the third and fourth MTJ structures 150c and 150d on neighboring ones of the second active patterns 108b in the respective even-numbered active region rows in the first direction.

In an implementation, the lower bit lines 156 may be formed by a damascene process. For example, an insulating interlayer may be formed on the first insulation pattern 140 to cover the MTJ structures 150. The insulating interlayer may be etched to form an opening. A conductive layer may be formed to fill the opening, and an upper portion of the conductive layer may be planarized to form the lower bit line 156.

Figure 20:
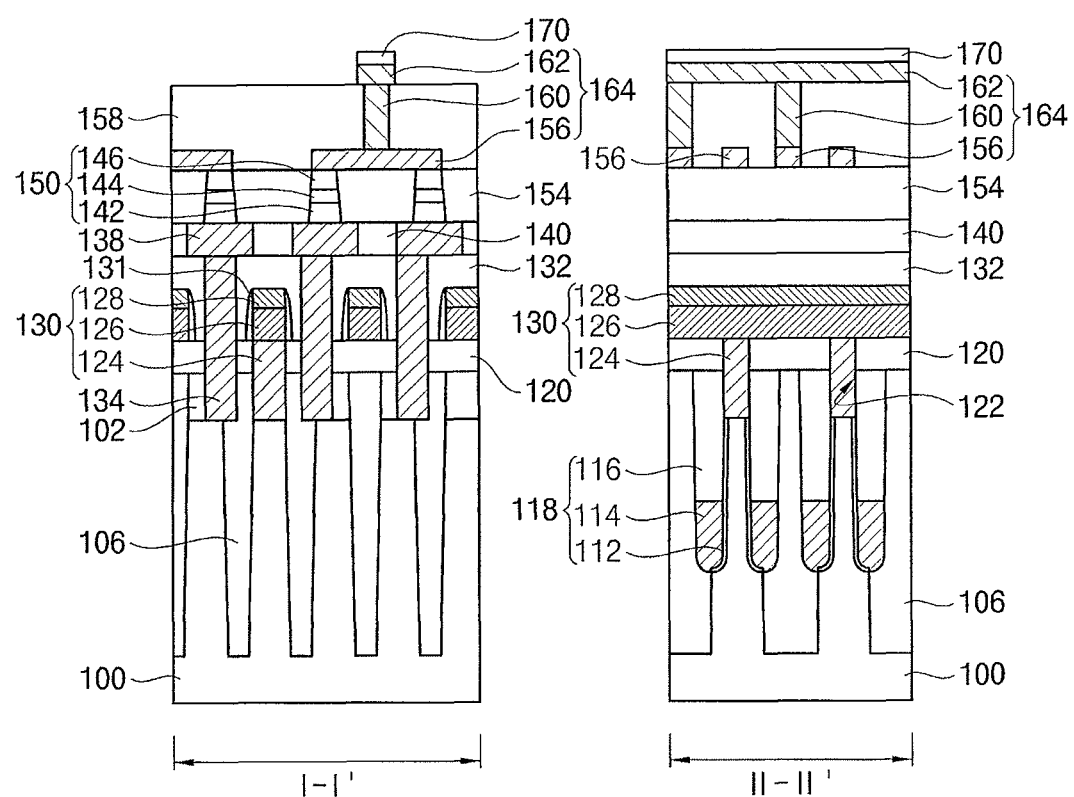

Referring to FIGS. 19 and 20, an upper insulating interlayer 158 may be formed to cover the lower bit lines 156. The upper insulating interlayer 158 may be etched to form bit line contact holes through the upper insulating interlayer 158 exposing upper surfaces of the lower bit lines 156. A conductive layer may be formed to fill the bit line contact holes, and may be planarized to form bit line contacts 160.

For example, a first bit line contact 160a may be formed to contact the first lower bit line 156a, and a second bit line contact 160b may be formed to contact the second lower bit line 156b. Each of the first and second bit line contacts 160a and 160b may be arranged in the first direction.

A conductive layer may be formed on the upper insulating interlayer 158 and the bit line contacts 160, and a fourth hard mask 170 may be formed on the conductive layer. The conductive layer may be etched using the fourth hard mask 170 as an etching mask to form an upper bit lines 162 extending in the first direction. Thus, a bit line structure 164 including the lower bit line 156, the bit line contact 160 and the upper bit line 162 may be formed.

For example, a first upper bit line 162a may be formed on the first bit line contact 160a, and the second bit line 162b may be formed on the second bit line contact 160b.

In an implementation, the upper bit line 162 may be formed by a damascene process. For example, an insulating interlayer may be further formed on the upper insulating interlayer 158 and the bit line contacts 160. The insulating interlayer may be etched to form a trench. A conductive layer may be formed to fill the trench, and an upper portion of the conductive layer may be planarized to form the upper bit line 162.

In an implementation, the bit line contacts 160 and the upper bit line 162 may be formed by a dual damascene process. For example, an upper insulating interlayer may be formed on the second insulation pattern 154 to cover the lower bit line 156. The upper insulating interlayer may be etched to form contact holes and trench. A conductive layer may be formed to fill the contact holes and the trench, and an upper portion of the conductive layer may be planarized to form the bit line contacts 160 and the upper bit line 162.

Then, an insulating interlayer may be formed to cover the bit line structure 164.

As described above, the MRAM device of FIG. 1 may be manufactured.

Figure 21:
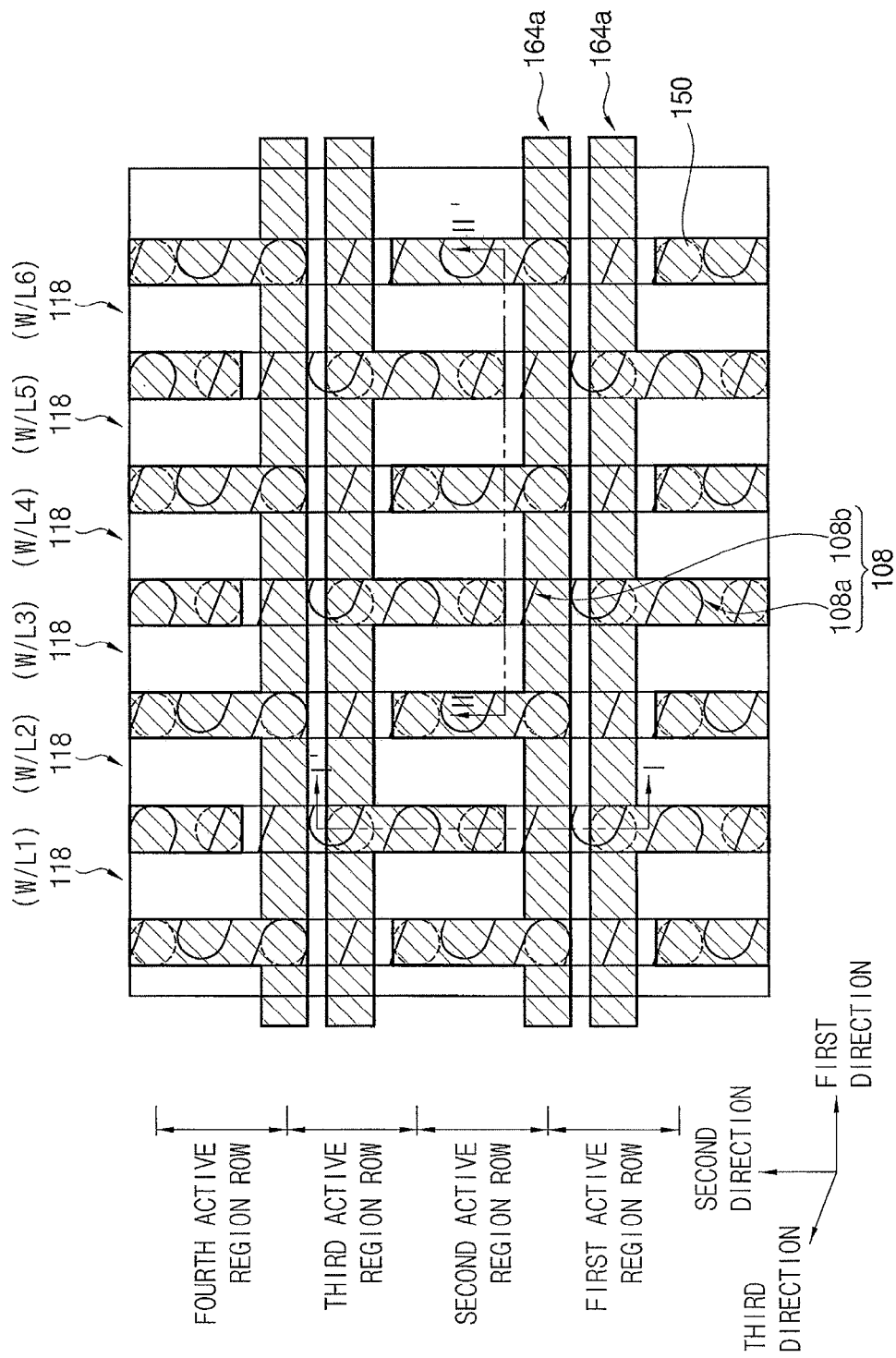
FIGS. 21 and 22 illustrate a plan view and a cross-sectional view, respectively, of an MRAM device in accordance with example embodiments.
Figure 22:
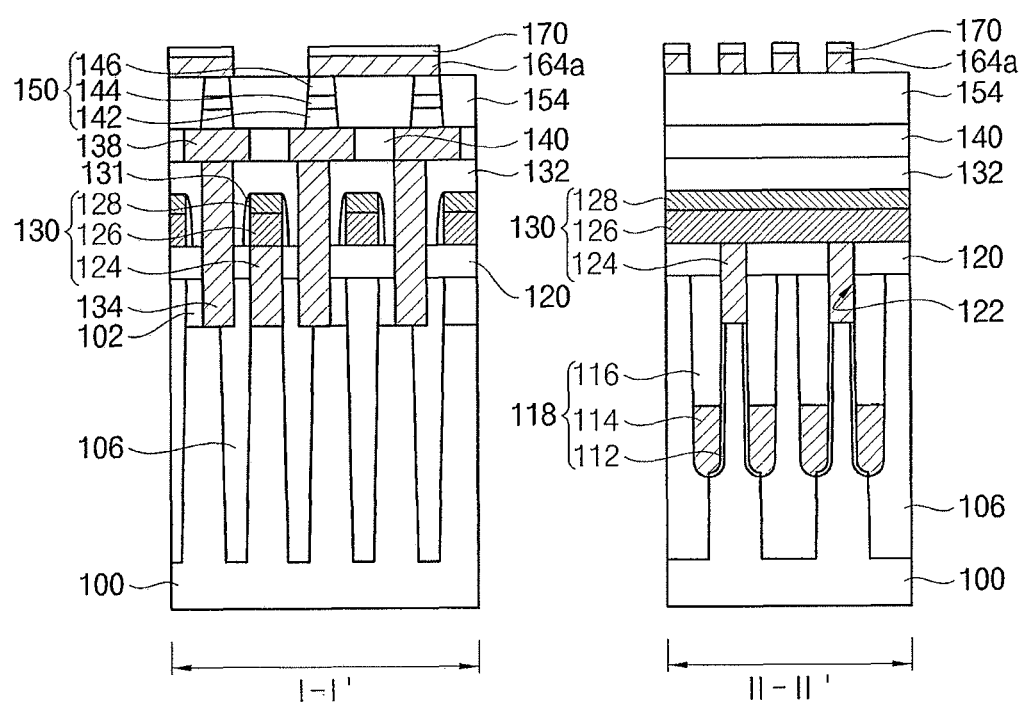

FIGS. 21 and 22 illustrate a plan view and a cross-sectional view, respectively, of an MRAM device in accordance with example embodiments.

The MRAM device of FIGS. 21 and 22 may be substantially the same as the MRAM device of FIGS. 1 and 2, except for a bit line.

Referring to FIGS. 21 and 22, the MRAM device may be formed on the substrate 100 including the active pattern 108. The MRAM device may include the transistor, the source line structure 130, the MTJ structure 150, and the bit line 164a. Elements formed below the bit line 164a, e.g., the active pattern 108, the source line structure 130, the MTJ structure 150, etc., may be substantially the same as those of MRAM device of FIGS. 1 and 2.

The bit line 164a may be electrically connected with the MTJ structure 150, which may be shared by the bit line 164a and the source line structure 130. The bit line 164a may extend in the first direction, and a plurality of bit lines 164a may be arranged (e.g., spaced apart from one another) in the second direction. In an implementation, the fourth hard mask 170 may be further formed on the bit line 164a.

The bit line 164a may include a first portion and a second portion. The first portion may extend in the first direction. The second portion may protrude from a sidewall of the first portion, and may be connected with the MTJ structure 150. Upper surfaces of the first and second portions may be coplanar with each other. Neighboring ones of the bit lines 164a may not be electrically connected to each other. Thus, the first portion of one of the bit lines 164a may be positioned between the second portions of neighboring ones of the bit lines 164a.

In an implementation, the first portion of the bit line 164a may correspond to the upper bit line of FIG. 1, and the second portion of the bit line may correspond to the lower bit line of FIG. 1. Thus, the bit line 164a may not include a lower bit line, a bit line contact, and an upper bit line.

For example, the bit line 164a may be connected with the first and second MTJ structures 150a and 150b (refer to FIG. 1) on the first active patterns 108a of the odd-numbered active region row. Also, the bit line 164a may be connected with the third and fourth MTJ structures 150c and 150d (refer to FIG. 1) formed on the second active patterns 108b of the even-numbered active region row.

The MRAM device of the FIGS. 21 and 22 may be manufactured by processes substantially the same as processes illustrated with reference to FIGS. 5 to 20. However, the processes for forming the lower bit line, the bit line contact, and the upper bit line may not be performed, and the bit line 164a may be formed to be electrically connected with the MTJ structures 150.

Figure 23:
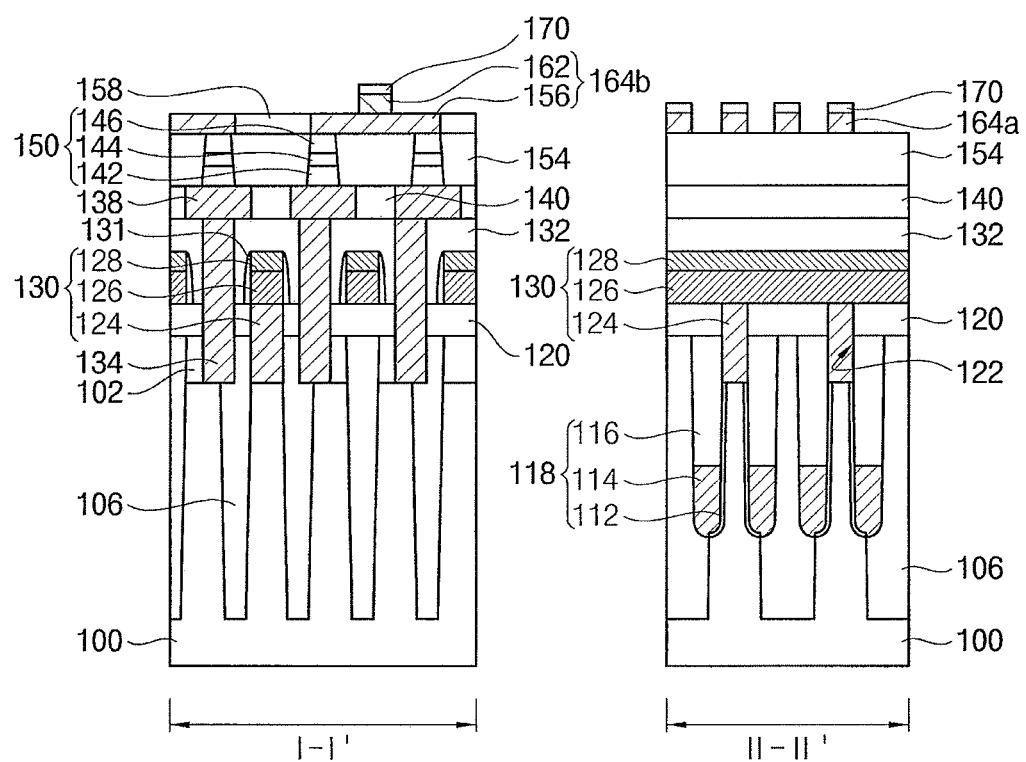
FIG. 23 illustrates a cross-sectional view of an MRAM device in accordance with example embodiments.

FIG. 23 illustrates a cross-sectional view of an MRAM device in accordance with example embodiments.

The MRAM device of FIGS. 21 and 22 may be substantially the same as the MRAM device of FIGS. 1 and 2, except for a bit line structure.

Referring to FIG. 23, the MRAM device may be formed on the substrate 100 including the active pattern 108. The MRAM device may include the transistor, the source line structure 130, the MTJ structure 150, and the bit line structure 164b. Elements formed below the bit line structure, e.g., the active pattern 108, the source line structure 130, the MTJ structure 150, etc., may be substantially the same as those of MRAM device of FIGS. 1 and 2.

The bit line structure 164b may be electrically connected with the MTJ structures 150, which may be shared by the bit line structure 164b and the source line structure 130. The bit line structure 164b may extend in the first direction, and a plurality of bit line structures 164b may be arranged in the second direction.

The bit line structure 164b may include a lower bit line 156 and an upper bit line 162, and the lower and upper bit lines 156 and 162 may directly contact each other. Thus, no bit line contact may be formed between the lower and upper bit lines 156 and 162. Neighboring ones of the bit lines may not be electrically connected to each other. Thus, the upper bit line 162 may be formed between the lower bit lines of neighboring ones of the bit line structures.

The MRAM device of the FIG. 23 may be manufactured by processes substantially the same as processes illustrated with reference to FIGS. 5 to 20. However, the processes for forming the bit line contact between the lower and upper bit lines may not be performed.

Figure 24:
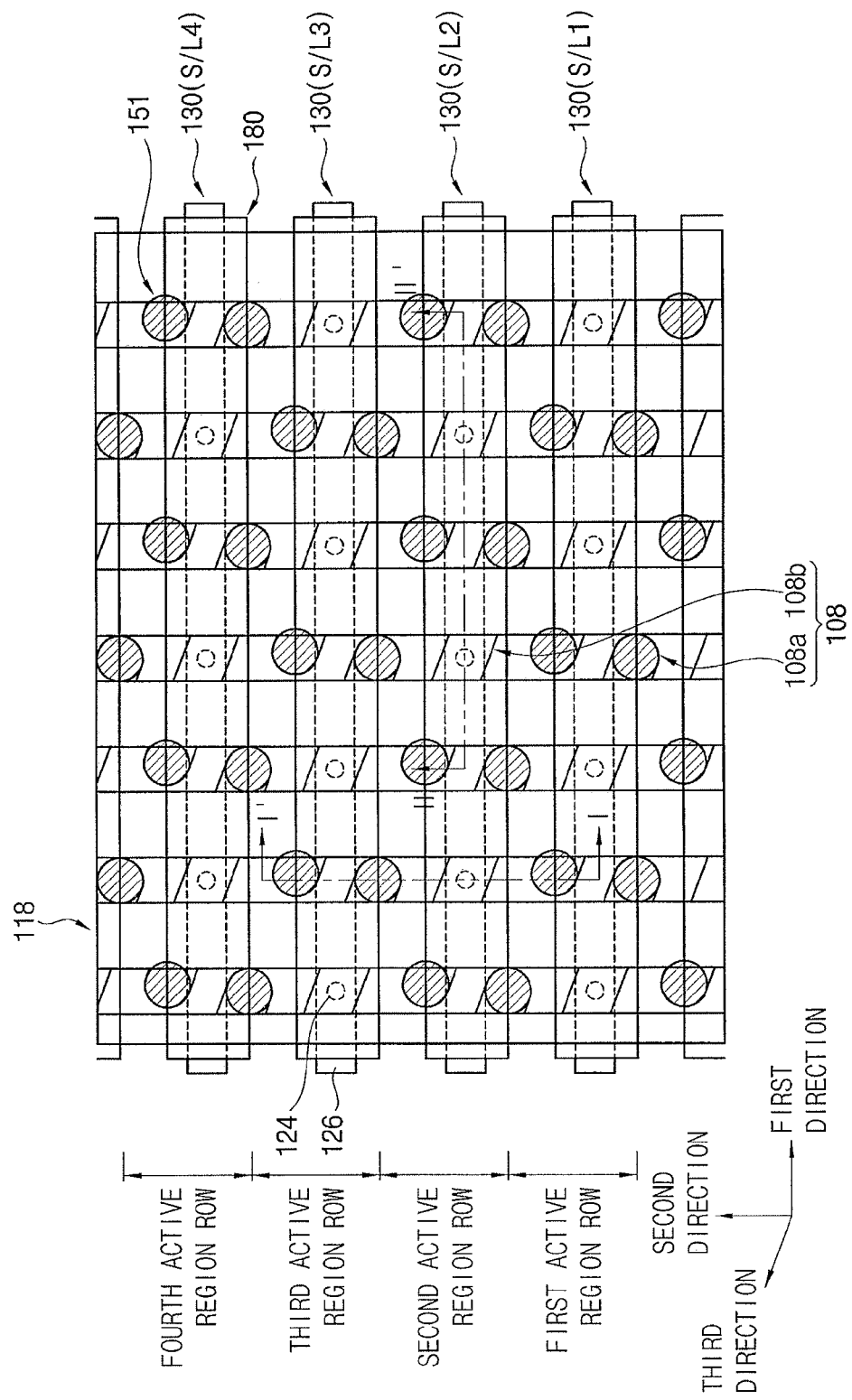
FIGS. 24 and 25 illustrate a plan view and a cross-sectional view, respectively, of an MRAM device in accordance with example embodiments.
Figure 25:
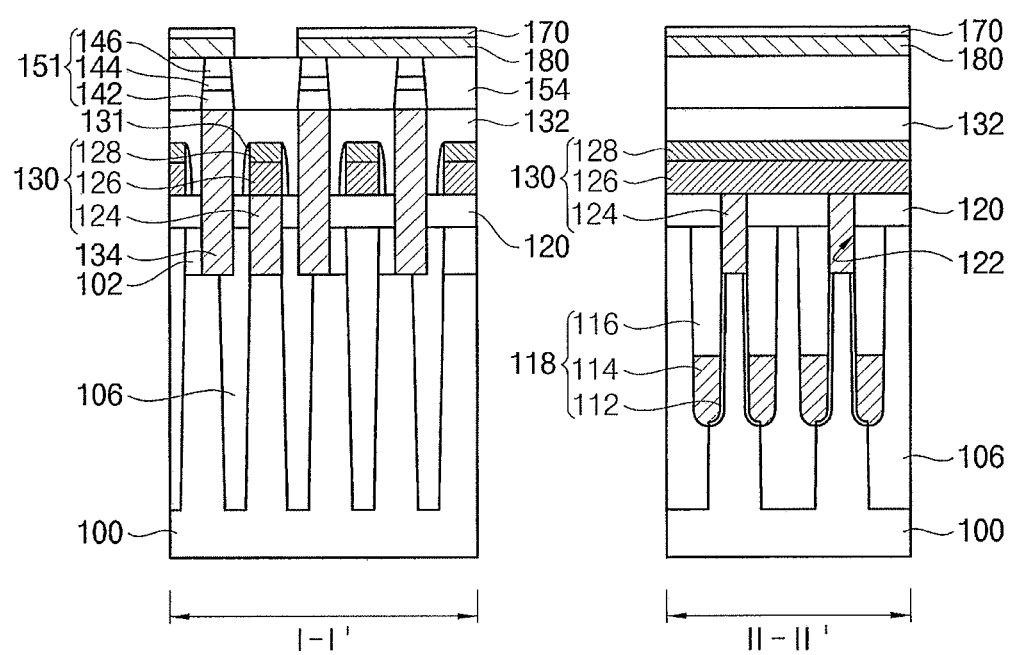

FIGS. 24 and 25 illustrate a plan view and a cross-sectional view, respectively, of an MRAM device in accordance with example embodiments.

Referring to FIGS. 24 and 25, the MRAM device may be formed on the substrate 100 including the active pattern 108. The MRAM device may include the transistor, the source line structure 130, an MTJ structure 151, and a bit line 180. Elements formed below the MTJ structure 150, such as the active pattern 108, the source line structure 130, the contact plug 134, etc., may be substantially the same as those of MRAM device of FIGS. 1 and 2.

The MTJ structure 151 may be formed on the contact plug 134. In an implementation, no pad pattern may be formed between the MTJ structure 151 and the contact plug 134.

In an implementation, a plurality of MTJ structures 151 may overlap drain regions of the active patterns 108, respectively. Thus, the MTJ structures 151 may be arranged in the first direction.

The bit line 180 may be electrically connected with the MTJ structures 151, which may be shared by the bit line 180 and the source line structure 130. The bit line 180 may extend in the first direction, and a plurality of bit lines 180 may be arranged in the second direction.

In an implementation, the bit line 180 may directly contact the upper electrode 146 of the MTJ structure 151. In an implementation, a bit line contact may further be formed between the bit line 180 and the MTJ structure 151, and the bit line 180 may be formed on the bit line contact.

The bit line 180 may be electrically connected with the MTJ structures 151, which may be connected to the drain regions on the active patterns 108 of each of the odd-numbered and even-numbered active region rows, and may extend in the first direction. For example, the bit line 180 may be connected with two drain regions formed on each of the active patterns 108. Thus, a width in the second direction of the bit line 180 may be greater than a distance in the second direction between two neighboring MTJ structures 151 below the bit line 180.

Thus, the bit line 180 may overlap the source line structure 130. The width in the second direction of the bit line 180 may be greater than a width in the second direction of the source line structure 130 below the bit line 180. Thus, the bit line 180 may not include a lower bit line and an upper bit line.

A fourth hard mask 170 formed on the bit line 180. An insulating interlayer may be further formed on the bit line 180 to fill spaces between the bit lines.

Figure 26:
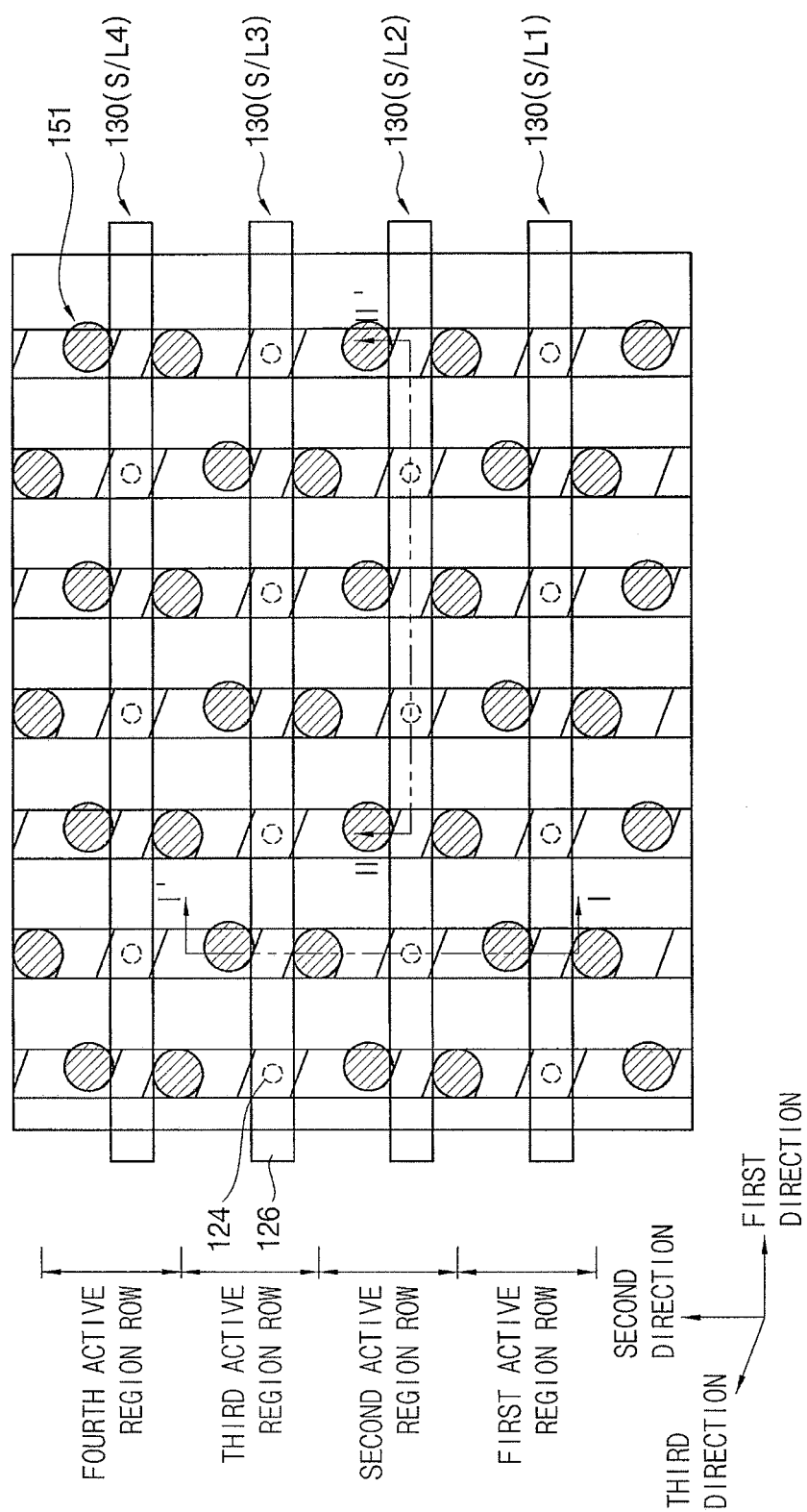
FIGS. 26 to 28 illustrate plan views and cross-sectional views of stages in a method of manufacturing an MRAM device in accordance with example embodiments.
Figure 27:
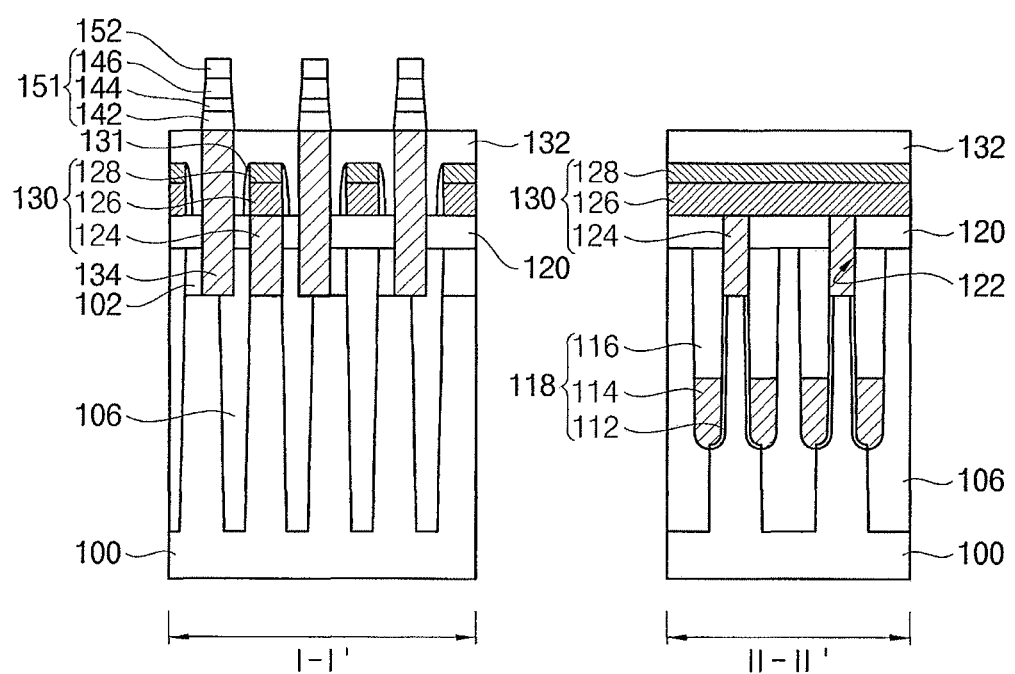
Figure 28:
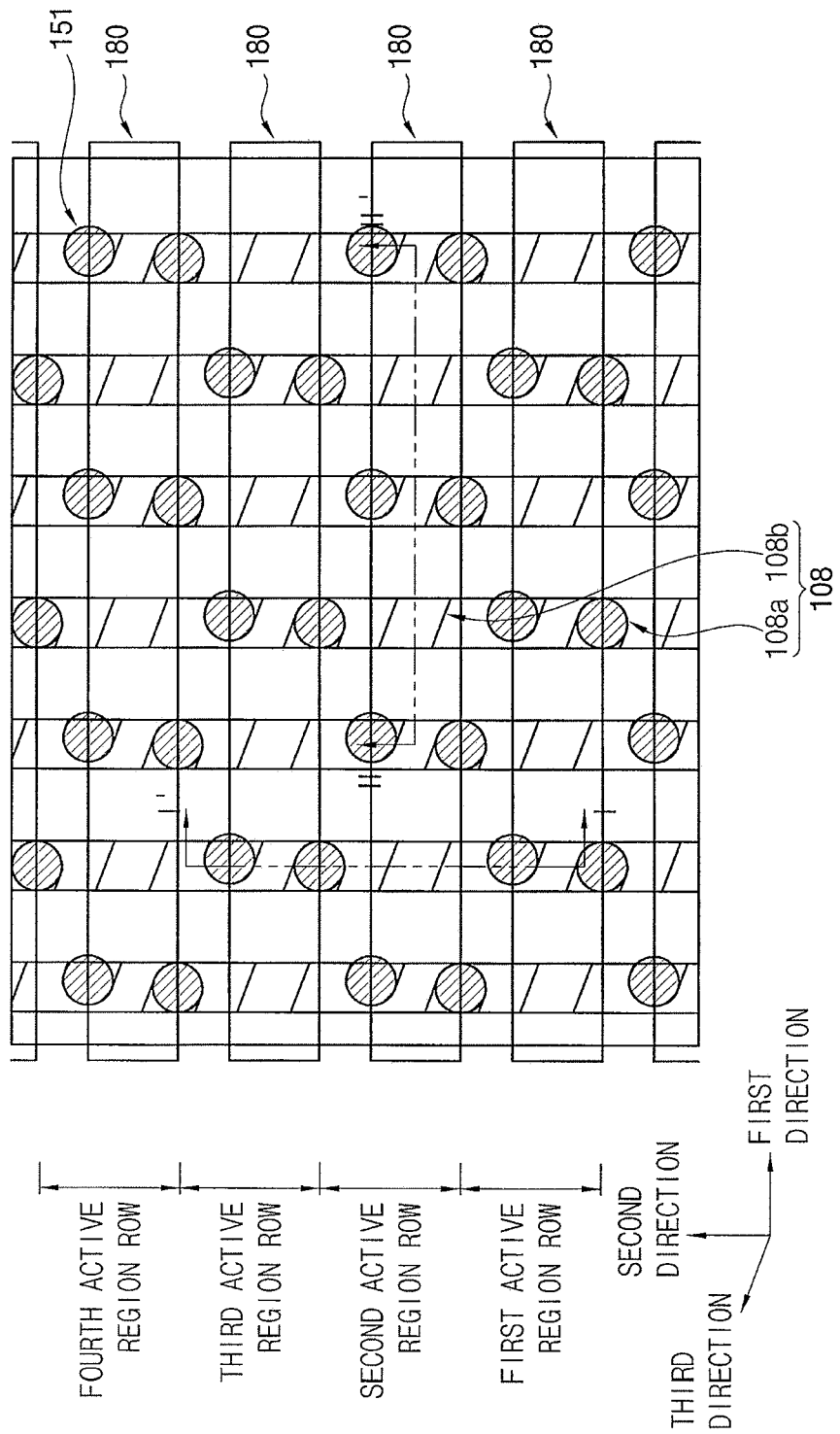

FIGS. 26 to 28 illustrate plan views and a cross-sectional view of stages in a method of manufacturing an MRAM device in accordance with example embodiments.

First, processes substantially the same as or similar to those illustrated with reference to FIGS. 5 to 12 may be performed.

Referring to FIGS. 26 and 27, a plurality of MTJ structures 151 may be formed on the contact plugs 134, respectively, to be spaced apart from each other.

The MTJ structure 151 may include a lower electrode 142, an MTJ pattern structure 144, and an upper electrode 146. A third hard mask 152 may be formed on the MTJ structure 151.

The MTJ structure 151 may be formed by processes substantially the same processes illustrated with reference to FIGS. 15 and 16.

In an implementation, the MTJ structures 151 may overlap the drain regions of the active patterns 108, respectively. Thus, the MTJ structures 151 may be arranged in the first direction.

FIG. 28 does not show the source line structure 130 for simplicity.

Referring to FIGS. 28, 24 and 25, an insulating interlayer may be formed to cover the MTJ structure 151. A bit line 180 may be formed through the insulating interlayer. The bit line 180 may extend in the first direction, and may contact the upper electrode 146 of the MTJ structure 151.

In an implementation, the insulating interlayer may be formed on the MTJ structures 151 to fill spaces between the MTJ structures. The insulating interlayer may be formed of an oxide, e.g., silicon oxide. An upper surface of the insulating interlayer may be further planarized.

The insulating interlayer and the third hard mask may be etched to form a trench for forming a bit line. The trench may extend in the first direction. The upper electrodes 151 of the MTJ structures may be exposed by the trench. The exposed MTJ structures may be connected with the drain regions of the active patterns 108 of each of the odd-numbered and even-numbered active region rows.

The bit line 180 may be formed in the trench. The bit line 180 may be formed by forming a barrier layer on sidewalls and a bottom of the trench, forming a metal layer on the barrier layer to fill the trench, and planarizing the metal layer and the barrier layer. The barrier layer may be formed of, e.g., titanium, tantalum, titanium nitride, tantalum nitride, etc. The metal layer may be formed of, e.g., tungsten, aluminum, copper, etc. Thus, the bit line may include a barrier pattern and a metal pattern. The bit line 180 may contact the upper electrode 146.

In an implementation, the insulating interlayer may be formed to fill a gap between the MTJ structures 151. A conductive layer may be formed on the insulating interlayer, and a fourth hard mask 170 may be formed on the conductive layer. The conductive layer may be etched using the fourth hard mask 170 as an etching mask to form the bit line 180.

The embodiments may provide a highly integrated MRAM device.

The embodiments may provide a method of manufacturing the highly integrated MRAM device.

In the MRAM device in accordance with example embodiments, the active pattern may extend in a diagonal direction of the first direction, and the MTJ structures included in memory cells which may be shared the source line structure may be electrically connected to each other via the bit line structure. Thus, a pair of one source line structure and one bit line structure may be formed on the substrate, so that an operating voltage for writing may be lowered. The MTJ structures may be arranged in a honeycomb structure. Thus, the MTJ structures may be easily formed on the substrate, and a disturbance between the MTJ structures may decrease.

The MRAM device according to example embodiments may be used in various types of electronic devices, e.g., mobile devices, memory cards, computers, etc.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A magnetoresistive random access memory (MRAM) device, comprising:

a substrate including a plurality of active patterns arranged along a first direction, each of the active patterns extending in a diagonal direction with respect to the first direction;

a plurality of gate structures on the substrate, the gate structures extending in a second direction substantially perpendicular to the first direction;

a source line structure electrically connected to source regions of the respective active patterns, the source line structure extending in the first direction;

a plurality of magnetic tunnel junction (MTJ) structures electrically connected to drain regions of the respective active patterns, the MTJ structures being spaced apart from each other; and a bit line structure electrically connected to the MTJ structures in respective memory cells, the memory cells sharing with the source line structure, wherein the MTJ structures are arranged in a honey comb structure so that the MTJ structures are disposed at vertices and centers of hexagons, and wherein the bit line structure includes a first portion extending in the first direction, and a second portion protruding from a sidewall of the first portion, the second portion electrically connecting two MTJ structures on neighboring two of the active patterns in the first direction, the MTJ structures being in the respective memory cells sharing the source line structure.

2. The device as claimed in claim 1, wherein:
the active patterns include first and second active region rows disposed in the second direction, the first active region row including a plurality of first active patterns disposed in the first direction, and the second active region row including a plurality of second active patterns disposed in the first direction, and
two gate structures are disposed on each of the active patterns.

3. The device as claimed in claim 1, further comprising:
a plurality of contact plugs contacting the drain regions of the active patterns, respectively; and
a pad pattern on each of the contact plugs, the pad pattern contacting a bottom of each of the MTJ structures.

4. The device as claimed in claim 1, wherein the bit line structure includes:
a plurality of lower bit lines spaced apart from each other in the second direction, each of the lower bit lines electrically connecting two MTJ structures on neighboring two of the active patterns in the first direction, the MTJ structures being in the respective memory cells sharing the source line structure;
a bit line contact on each of the lower bit lines; and
an upper bit line on the bit line contact, the upper bit line extending in the first direction.

5. The device as claimed in claim 4, wherein each of the lower bit lines extends in the second direction.

6. The device as claimed in claim 1, wherein the bit line structure includes:
a plurality of lower bit lines spaced apart from each other in the second direction, each of the lower bit lines electrically connecting two MTJ structures on neighboring two of the active patterns in the first direction, the MTJ structures being in the respective memory cells sharing the source line structure; and
an upper bit line on each of the lower bit lines, the upper bit line extending in the first direction.

7. The device as claimed in claim 1, further comprising contact plugs on the drain regions of the active patterns, respectively, wherein the MTJ structures contact the contact plugs, respectively.

8. The device as claimed in claim 7, wherein:
the bit line structure connects the MTJ structures on the respective active patterns to each other, the active patterns sharing the source line structure, and
the bit line structure extends in the first direction.

9. The device as claimed in claim 8, wherein a width in the second direction of the bit line structure is greater than a distance in the second direction between the drain regions of each of the active patterns.

10. A magnetoresistive random access memory (MRAM) device, comprising:
a substrate including an active pattern array thereon, the active pattern array including a plurality of active pattern rows disposed in a second direction, each of the active pattern rows including a plurality of active patterns disposed in a first direction substantially perpendicular to the second direction, and each of the active patterns extending in a diagonal direction with respect to the first direction;
a plurality of gate structures on the substrate, the gate structures extending in the second direction;
a source line structure electrically connected to source regions of the respective active patterns, the source line extending in the first direction;
a plurality of contact plugs contacting drain regions of the respective active patterns;
a plurality of pad patterns on the contact plugs, respectively;
a plurality of MTJ structures on the pad patterns, respectively, the MTJ structures being spaced apart from each other; and
a bit line structure electrically connecting the MTJ structures with each other, the MTJ structures being in memory cells sharing the source line structure,
wherein the MTJ structures are arranged in a honey comb structure so that the MTJ structures are disposed at vertices and centers of hexagons,
wherein the bit line structure includes a first portion extending in the first direction, and a second portion protruding from a sidewall of the first portion, the second portion electrically connecting two MTJ structures on neighboring two of the active patterns in the first direction.

11. The device as claimed in claim 10, wherein first ones of the active patterns in respective odd-numbered active pattern rows and second ones of the active patterns in respective even-numbered active pattern rows are disposed with each other in a direction having an acute angle with respect to the second direction.

12. The device as claimed in claim 10, wherein each of the pad patterns extends in the first direction to overlap a portion of an isolation layer between the active patterns, and the pad patterns are spaced apart from each other.

13. A magnetoresistive random access memory (MRAM) device, comprising:
a substrate including a plurality of active patterns spaced apart from one another along a first direction, each of the active patterns having a major axis that crosses the first direction and is inclined at an angle relative to the first direction;
a plurality of gate structures on the substrate, the gate structures extending in a second direction that is substantially perpendicular to the first direction;

a source line structure electrically connected to source regions of the respective active patterns, the source line structure extending in the first direction;

a plurality of magnetic tunnel junction (MTJ) structures electrically connected to drain regions of the respective active patterns, the MTJ structures being spaced apart from each other; and a bit line structure electrically connected to respective ones of the MTJ structures, the bit line structure being paired with the source line structure, wherein the MTJ structures are arranged in a honey comb structure so that the MTJ structures are disposed at vertices and centers of hexagons, and wherein the bit line structure includes a first portion extending in the first direction, and a second portion protruding from a sidewall of the first portion, the second portion electrically connecting two MTJ structures on neighboring two of the active patterns in the first direction, the MTJ structures being in respective memory cells sharing the source line structure.

14. The device as claimed in claim 13, further comprising:

a plurality of contact plugs contacting the drain regions of the active patterns, respectively; and a pad pattern on each of the contact plugs, the pad pattern contacting a bottom of each of the MTJ structures.

15. The device as claimed in claim 13, wherein major axes of first ones of the active patterns in respective odd-numbered active pattern rows and second ones of the active patterns in respective even-numbered active pattern rows are parallel with each other.

* * * * *